United States Patent
Bash et al.

(10) Patent No.: US 7,117,129 B1
(45) Date of Patent: Oct. 3, 2006

(54) COMMISSIONING OF SENSORS

(75) Inventors: Cullen E. Bash, San Francisco, CA (US); Chandrakant D. Patel, Fremont, CA (US); Ratnesh K. Sharma, Union City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/078,087

(22) Filed: Mar. 11, 2005

(51) Int. Cl.
G05B 21/00 (2006.01)

(52) U.S. Cl. .................. 702/194; 702/45; 702/127; 700/276

(58) Field of Classification Search .............. 702/194, 702/45, 47, 50, 104, 105, 98, 99, 100, 113, 702/114, 116, 127, 130, 136, 138, 140, 179, 702/183, 186, 190
See application file for complete search history.

(56) References Cited

U.S. PATENT DOCUMENTS

| | | | |
|---|---|---|---|
| 6,574,104 B1 * | 6/2003 | Patel et al. | 361/695 |
| 6,697,707 B1 * | 2/2004 | Peters, II | 700/245 |
| 2006/0075764 A1 * | 4/2006 | Bash et al. | 62/178 |

* cited by examiner

Primary Examiner—Hal D. Wachsman
(74) Attorney, Agent, or Firm—Richard P. Lange

(57) ABSTRACT

A method for commissioning sensors includes determining correlation data between the sensors and a plurality of actuators. The correlation data is based upon conditions detected by the sensors at a plurality of actuator settings. Correlation indexes are calculated from the correlation data, where a correlation index for a sensor is a function of the plurality of actuator settings and a particular actuator. In addition, each of the sensors is assigned to at least one of a plurality of actuator families based upon the calculated correlation indexes of the sensors to thereby commission the sensors.

24 Claims, 11 Drawing Sheets

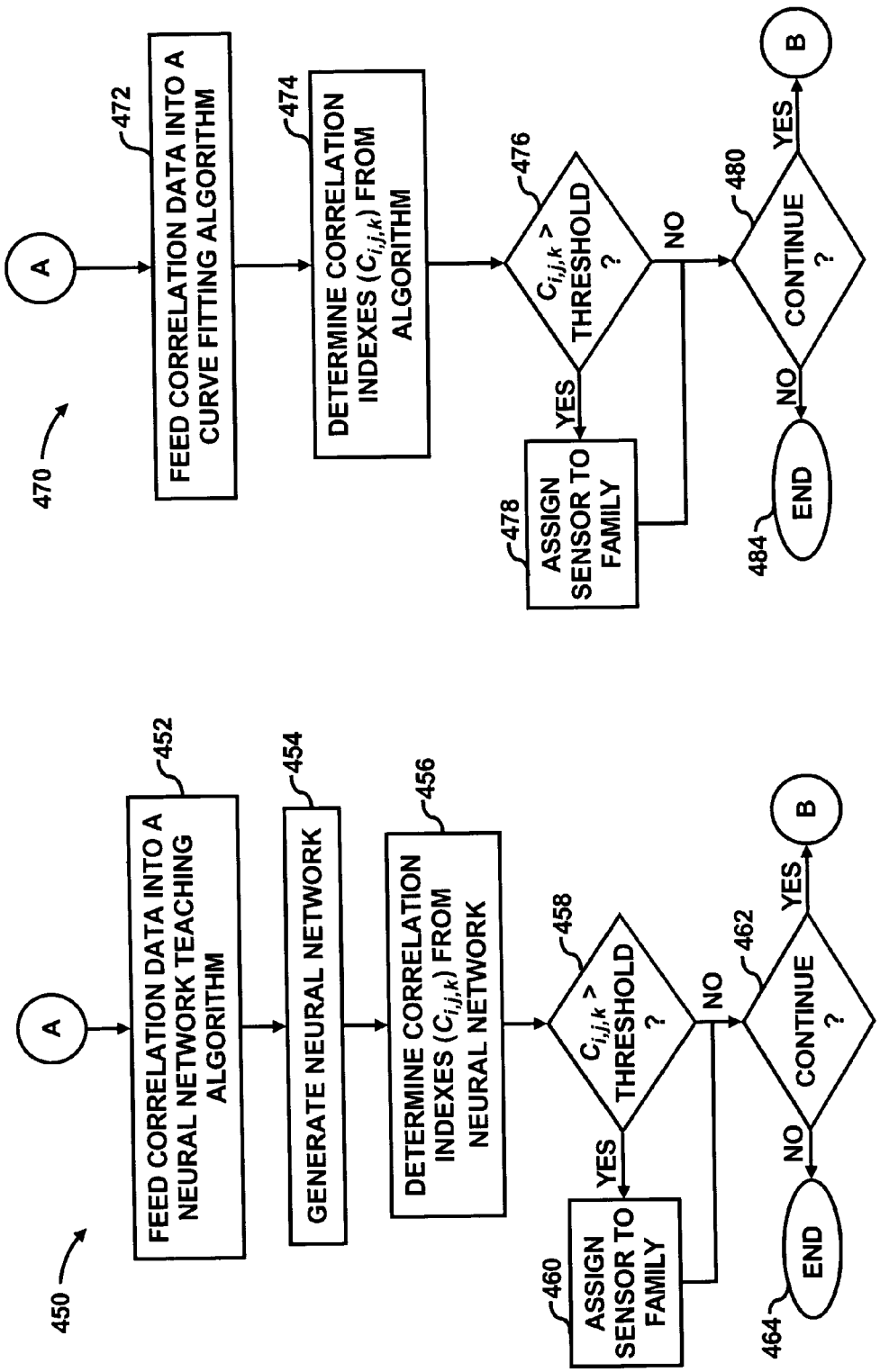

COMMISSIONING OF SENSORS

BACKGROUND

A data center may be defined as a location, for instance, a room that houses computer systems arranged in a number of racks. A standard rack, for example, an electronics cabinet, is defined as an Electronics Industry Association (EIA) enclosure, 78 in. (2 meters) high, 24 in. (0.61 meter) wide and 30 in. (0.76 meter) deep. These racks are configured to house a number of computer systems, about forty (40) systems, with future configurations of racks being designed to accommodate 200 or more systems. The computer systems typically include a number of printed circuit boards (PCBs), mass storage devices, power supplies, processors, micro-controllers, and semi-conductor devices, that dissipate relatively significant amounts of heat during their operation. For example, a typical computer system containing multiple microprocessors dissipates approximately 250 W of power. Thus, a rack containing forty (40) computer systems of this type dissipates approximately 10 KW of power.

Current approaches to provisioning cooling to dissipate the heat generated by the cooling systems are typically based upon temperatures detected at the inlets of air conditioning units. Oftentimes, however, the temperatures detected at the air conditioning unit inlets are not an accurate reflection of the temperatures of the computer systems being cooled. In many instances, therefore, the provisioning of the cooling is based on the nameplate power ratings of all of the computer systems in the data center, with some slack for risk tolerance. This type of cooling provisioning oftentimes leads to excessive and inefficient cooling solutions. This problem is further exacerbated by the fact that in most data centers, the cooling is provisioned for worst-case or peak load scenarios. Since it is estimated that typical data center operations only utilize a fraction of the servers, provisioning for these types of scenarios often increases the inefficiencies found in conventional cooling arrangements.

As such, it would be beneficial to have effective thermal management that does not suffer from the inefficiencies found in conventional data center cooling arrangements.

SUMMARY OF THE INVENTION

A method for commissioning sensors is disclosed herein. In the method, correlation data between the sensors and a plurality of actuators is determined. The correlation data is based upon conditions detected by the sensors at a plurality of actuator settings. Correlation indexes are calculated from the correlation data, where a correlation index for a sensor is a function of the plurality of actuator settings and a particular actuator. In addition, each of the sensors is assigned to at least one of a plurality of actuator families based upon the calculated correlation indexes of the sensors to thereby commission the sensors.

BRIEF DESCRIPTION OF THE DRAWINGS

Features of the present invention will become apparent to those skilled in the art from the following description with reference to the figures, in which:

FIG. 4B illustrates a flow diagram of an operational mode for assigning sensors to respective actuator families based upon a neural network, according to an embodiment of the invention;

FIG. 4C illustrates a flow diagram of an operational mode for assigning sensors to respective actuator families based upon a curve fitting algorithm, according to an embodiment of the invention;

DETAILED DESCRIPTION OF THE INVENTION

Figure 1A:
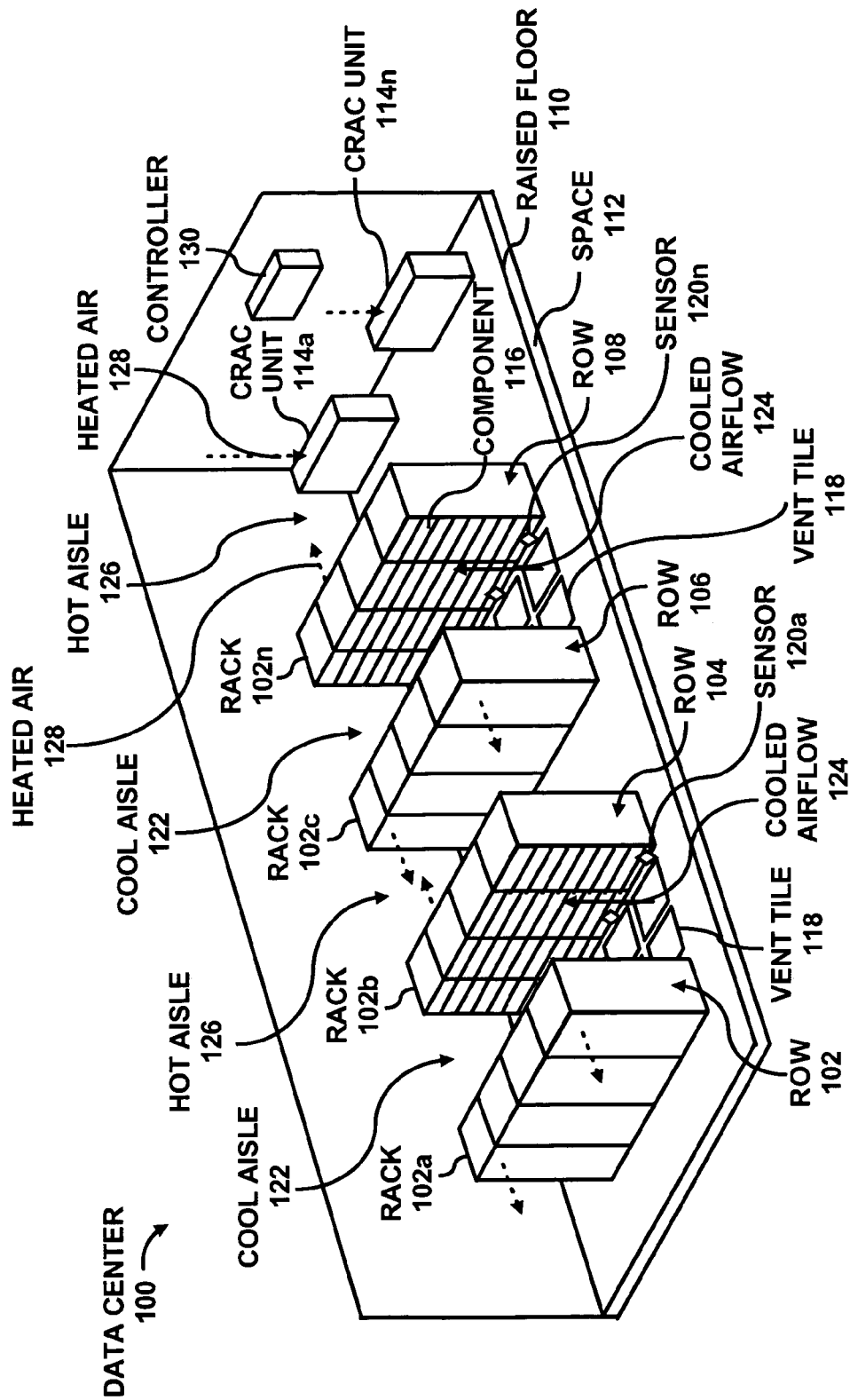
FIG. 1A shows a simplified perspective view of a data center, according to an embodiment of the invention.

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

A system and method for commissioning sensors is disclosed herein. More particularly, the sensors may be related to a number of actuators, for instance, computer room air conditioning (CRAC) units. The relationships are described in terms of actuator families and the sensors are assigned to respective actuator families based upon the relative effects that each actuator has on each sensor. Thus, for instance, a sensor may be assigned to an actuator family if the actuator of that family affects that sensor beyond a predefined threshold.

Data pertaining to correlations between the sensors and the actuators may be collected through different types of detected conditions. In a first example, temperature is the detected condition and the temperature of the airflow supplied by CRAC units is manipulated to obtain the data. In a second example, relative pressure is the detected condition and the flow rates at which airflow is supplied by CRAC units is manipulated to obtain the data. In a third example, absolute humidity is the detected condition and the level of humidification or dehumidification supplied into the airflow by CRAC units is manipulated to obtain the data.

The data may be used, in a first example, to form a neural network that establishes correlations between various CRAC unit settings and sensor measurements. In this example, the model created by the neural network may be implemented to assign the sensors to the CRAC unit families. In a second example, a curve fitting algorithm may be used to fit a multi-variant, polynomial function to the data set that defines the correlations between the sensors and the CRAC units. In this example, the calculated correlations may be used to assign the sensors to the CRAC unit families.

An optional algorithm for filtering the sensors belonging to multiple CRAC unit families is also disclosed. The filtering algorithm may be implemented to, for instance, substantially prevent multiple CRAC units from competing to affect the same sensors, which may result in wasted energy usage.

The systems and methods for commissioning sensors disclosed herein may be employed in any reasonably suitable environment containing actuators and sensors, such as, a building containing air conditioning units and sensors. In this regard, although particular reference is made throughout the present disclosure to data centers and CRAC units, it should be understood that the systems and methods disclosed herein may be implemented in other environments. In addition, therefore, the particular references to data centers and CRAC units are for illustrative purposes and are not intended to limit the systems and methods disclosed herein solely to data centers and CRAC units.

With reference first to FIG. 1A, there is shown a simplified perspective view of a section of a data center 100 which may employ various examples of the invention. The terms "data center" are generally meant to denote a room or other space where one or more components capable of generating heat may be situated. In this respect, the terms "data center" are not meant to limit the invention to any specific type of room where data is communicated or processed, nor should it be construed that use of the terms "data center" limits the invention in any respect other than its definition herein above.

It should be readily apparent that the data center 100 depicted in FIG. 1A represents a generalized illustration and that other components may be added or existing components may be removed or modified without departing from the scope of the invention. For example, the data center 100 may include any number of racks and various other components. In addition, it should also be understood that heat generating/dissipating components may be located in the data center 100 without being housed in racks.

The data center 100 is depicted as having a plurality of racks 102a–102n, where "n" is an integer greater than one. The racks 102a–102n may comprise, for instance, electronics cabinets, aligned in parallel rows. Each of the rows 102–108 of racks 102a–102n is shown as containing four racks 102a–102n positioned on a raised floor 110. A plurality of wires and communication lines (not shown) may be located in a space 112 beneath the raised floor 110. The space 112 may also function as a plenum for delivery of cooled air from one or more computer room air conditioning (CRAC) units 114a–114n, where "n" is an integer greater than one, to the racks 102a–102n. The cooled air may be delivered from the space 112 to the racks 102a–102n through vent tiles 118 located between some or all of the racks 102a–102n. The vent tiles 118 are shown as being located between rows 102 and 104 and 106 and 108.

The cooled air contained in the space 112 may include cooled air supplied by one or more CRAC units 114a–114n. Thus, characteristics of the cooled air, such as, temperature, pressure, flow rate, etc., may substantially be affected by one or more of the CRAC units 114a–114n. In this regard, characteristics of the cooled air at various areas in the space 112 and the cooled air supplied to the racks 102a–102n may vary, for instance, if the temperatures or the volume flow rates of the cooled air supplied by these CRAC units 114a–114n due to mixing of the cooled air. In other words, the characteristics of the cooled air supplied to a particular location in the data center 100 may differ from that of the cooled air supplied by a single CRAC unit 114a.

At least one condition, for instance, temperature, pressure, or humidity, of the cooled air supplied to various areas of the data center 100 may be detected by sensors 120a–120n designed to detect the at least one condition, where "n" is an integer greater than one. As shown, the sensors 120a–120n are represented as diamonds to distinguish them from other elements depicted in FIG. 1A. In addition, the sensors 120a–120n are depicted as being positioned to detect the at least one condition at the inlets of the racks 102a–102n. In this example, the sensors 120a–120n may comprise temperature sensors or absolute humidity sensors. In another example, the sensors 120a–120n may be positioned within the space 112 near respective vent tiles 118 to detect the temperature, pressure, or humidity of the cooled air supplied through the respective vent tiles 118.

In any regard, the sensors 120a–120n may be employed to detect the at least one condition at various CRAC unit 114a–114n settings. In addition, the sensors 120a–120n may be assigned to the families of one or more CRAC units 114a–114n. A CRAC unit 114a–114n "family" may be defined as a grouping of sensors 120a–120n that respond to the various CRAC unit 114a–114n settings to levels greater than a predefined threshold level. In other words, the sensor 120a may be considered as being in the CRAC unit 114a family if the response of the sensor 120a exceeds a predefined threshold level at various CRAC unit 114a–114n settings. Various manners in which the sensors 120a–120n may be assigned to one or more CRAC unit 114a–114n families is described in greater detail herein below.

The vent tiles 118 may comprise manually or remotely adjustable vent tiles. In this regard, the vent tiles 118 may be manipulated to vary, for instance, the mass flow rates of cooled air supplied to the racks 102a–102n. In addition, the vent tiles 118 may comprise the dynamically controllable vent tiles disclosed and described in commonly assigned U.S. Pat. No. 6,574,104, the disclosure of which is hereby incorporated by reference in its entirety. As described in the U.S. Pat. No. 6,574,104 patent, the vent tiles 118 are termed "dynamically controllable" because they generally operate to control at least one of velocity, volume flow rate and direction of the cooled airflow therethrough. In addition, specific examples of dynamically controllable vent tiles 118 may be found in U.S. Pat. No. 6,694,759, filed on Jan. 27, 2003, which is assigned to the assignee of the present invention and is incorporated by reference herein in its entirety.

The racks 102a–102n are generally configured to house a plurality of components 116 capable of generating/dissipating heat, for instance, processors, micro-controllers, high-speed video cards, memories, semi-conductor devices, and the like. The components 116 may be elements of a plurality of subsystems (not shown), for instance, computers, servers, bladed servers, etc. The subsystems and the components may be operated to perform various electronic functions, for instance, computing, switching, routing, displaying, and the like.

The areas between the rows 102 and 104 and between the rows 106 and 108 may comprise cool aisles 122. These aisles are considered "cool aisles" because they are configured to receive cooled airflow from the vent tiles 118, as generally indicated by the arrows 124. In addition, and as shown, the racks 102a–102n generally receive cooled air from the cool aisles 122. The aisles between the rows 104 and 106, and on the rear sides of rows 102 and 108, are considered hot aisles 126. These aisles are considered "hot aisles" because they are positioned to receive air that has been heated by the components 116 in the racks 102a–102n, as indicated by the arrows 128.

The sides of the racks 102a–102n that face the cool aisles 122 may be considered as the fronts of the racks 102a–102n and the sides of the racks 102a–102n that face away from the cool aisles 122 may be considered as the rears of the racks 102a–102n. For purposes of simplicity and not of limitation, this nomenclature will be relied upon throughout the present disclosure to describe the various sides of the racks 102a–102n.

According to another example, the racks 102a–102n may be positioned with their rear sides adjacent to one another (not shown). In this example, the vent tiles 118 may be provided in each aisle 122 and 126. In addition, the racks 102a–102n may comprise outlets on top panels thereof to enable heated air to flow out of the racks 102a–102n.

As described herein above, the CRAC units 114a–114n generally operate to cool received heated air as indicated by the arrows 128. In addition, the CRAC units 114a–114n may supply the racks 102a–102n with airflow that has been cooled, through any reasonably suitable known manners and may thus comprise widely available, conventional CRAC units. For instance, the CRAC units 114a–114n may comprise vapor-compression type air conditioning units, chiller type air conditioning units, etc. Examples of suitable CRAC units 114a–114n may be found in co-pending and commonly assigned U.S. patent application Ser. No. 10/853,529, filed on May 26, 2004, and entitled "Energy Efficient CRAC Unit Operation," the disclosure of which is hereby incorporated by reference in its entirety.

Also shown in FIG. 1A is a controller 130 configured to perform various functions in the data center 100. As described in greater detail herein below, the controller 130 may receive data from the CRAC units 114a–114n and the sensors 130 and may perform various computations on the data. In one regard, the controller 130 may operate to assign the sensors 130 into one or more CRAC unit 114a–114n families. Although the controller 130 is illustrated in FIG. 1A as comprising a component separate from the components 116 housed in the racks 102–108, the controller 130 may comprise one or more of the components 116 without departing from a scope of the data center 100 disclosed herein. In addition, or alternatively, the controller 130 may comprise software configured to operate on a computing device, for instance, one of the components 116.

The data center 100 is illustrated in FIG. 1A as containing four rows 102–108 of racks 102a–102n and two CRAC units 114a–114n for purposes of simplicity and illustration. Thus, the data center 100 should not be construed as being limited in any respect to the number of racks 102a–102n and CRAC units 114a–114n illustrated in FIG. 1A. In addition, although the racks 102a–102n have all been illustrated similarly, the racks 102a–102n may comprise heterogeneous configurations. For instance, the racks 102a–102n may be manufactured by different companies or the racks 102a–102n may be designed to house differing types of components 116, for example, horizontally mounted servers, bladed servers, etc.

Figure 1B:
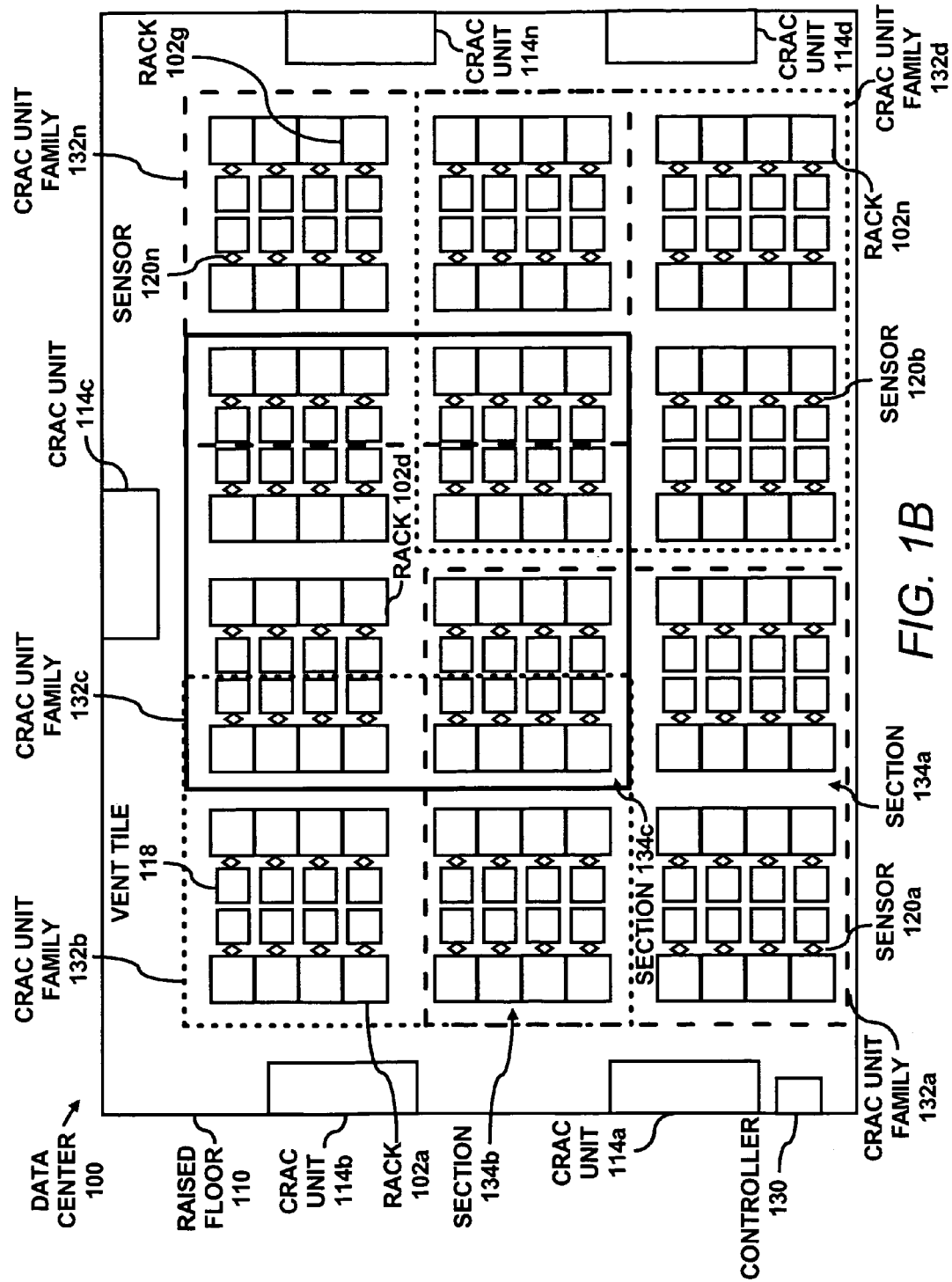
FIG. 1B is a simplified plan view of the data center depicted in FIG. 1A.

With reference now to FIG. 1B, there is shown a simplified plan view of the data center 100 depicted in FIG. 1A. The data center 100 is shown as including CRAC units 114a–114n positioned at various locations throughout the data center 100. A plurality of vent tiles 118 are also illustrated in FIG. 1B and are configured to deliver cooled airflow to racks 102a–102n as described above. It should be appreciated that the data center 100 may include any reasonably suitable number of racks 102a–102n and CRAC units 114a–114n without departing from the data center 100 illustrated in FIG. 1B.

As described herein above, the vent tiles 118 and the racks 102a–102n are positioned on a raised floor 110, beneath which lies a space 112 (FIG. 1A). The space 112 is in fluid communication with the CRAC units 114a–114n and generally operates, in one respect, as a plenum for supplying cooling airflow from the CRAC units 114a–114n to be delivered through the vent tiles 118. In most instances, the space 112 may comprise a relatively open space that is accessible by cooling airflow supplied by a plurality of the CRAC units 114a–114n. In this regard, the cooling airflow supplied by the CRAC units 114a–114n may mix in the space 112. Therefore, the cooling airflow supplied to the racks 102a–102n by the vent tiles 118 may have originated from more than one of the CRAC units 114a–114n.

Also shown in FIG. 1B are the sensors 120a–120n, which are illustrated as being positioned with respect to each of the racks 102a–102n. As also stated above, the sensors 120a–120n may also, or in the alternative, be positioned to detect the at least one condition within the space 112. In any regard, the sensors 120a–120n may be grouped in various CRAC unit 114a–114n families based upon various criteria, as described in greater detail herein below. The various actuator or CRAC unit 114a–114n families 132a–132n corresponding to respective CRAC units 114a–114n are illustrated in FIG. 1B. As shown, the sensors 120a–120n are considered as being within the families 132a–132n of those CRAC units 114a–114n.

Some of the sensors 120a–120n, for instance, the sensors 120a–120n in a first section 134a may be included in the family 132a of a single CRAC unit 114a. Some of the other sensors 120a–120n, for instance, the sensors 120a–120n in a second section 134b may be included in the families 132a and 132b of two CRAC units 114a and 114b. In addition, some of the sensors 120a–120n, for instance, the sensors 120a–120n in a third section 134c may be included in the families 132a–132c of three CRAC units 114a–114c. As such, for instance, one or more of the sensors 120a–120n may belong to more than one CRAC unit 114a–114n family.

It should, in any regard, be understood that the families 132a–132n depicted in FIG. 1B are for purposes of illustration and are not intended to limit the data center 100 and its components in any respect. It should also be understood that the depiction of the families 132a–132n in FIG. 1B are for illustrative purposes only and are not meant to limit the data center 100 in any respect.

Figure 2:
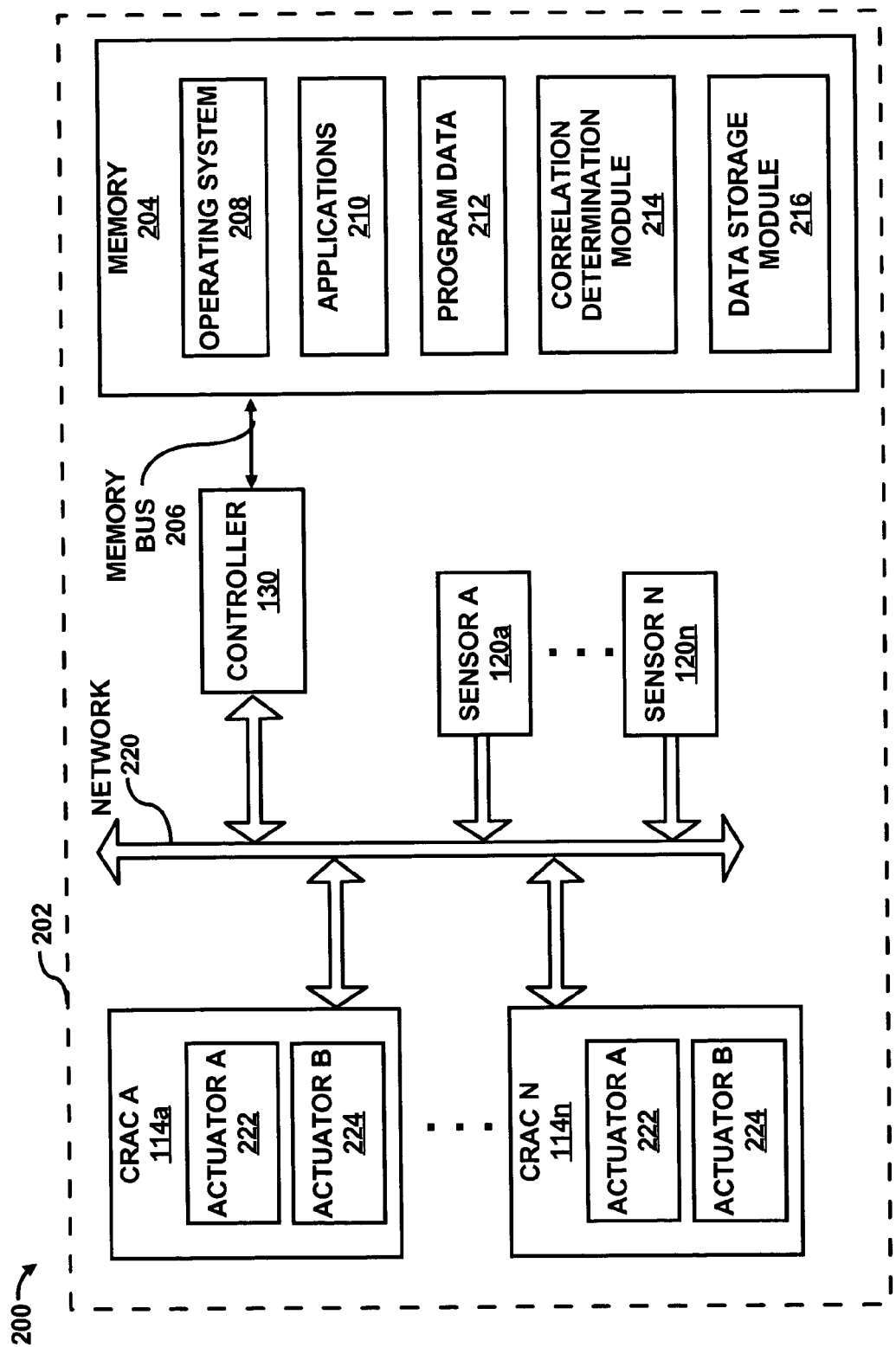
FIG. 2 is a block diagram of a sensor commissioning system according to an embodiment of the invention.

FIG. 2 is a block diagram 200 of a sensor commissioning system 202. It should be understood that the following description of the block diagram 200 is but one manner of a variety of different manners in which such a sensor commissioning system 202 may be configured. In addition, it should be understood that the sensor commissioning system 202 may include additional components and that some of the components described herein may be removed and/or modified without departing from the scope of the sensor commissioning system 202. For instance, the sensor commissioning system 202 may include any number of sensors, memories, processors, CRAC units, etc., as well as other components, which may be implemented in the operations of the sensor commissioning system 202.

As shown, the sensor commissioning system 202 includes the controller 130 depicted in FIGS. 1A and 1B. As described hereinabove, the controller 130 is configured to perform various functions in the data center 100. In this regard, the controller 130 may comprise a computing device, for instance, a computer system, a server, etc. In addition, the controller 130 may comprise a microprocessor, a microcontroller, an application specific integrated circuit (ASIC), and the like, configured to perform various processing functions. In addition, or alternatively, the controller 130 may comprise software operating in any of a number of computing devices.

The controller 130 is illustrated as being in communication with a memory 204 through, for instance, a memory bus 206. However, in certain instances, the memory 204 may form part of the controller 130 without departing from a scope of the sensor commissioning system 202. Generally speaking, the memory 204 may be configured to provide storage of software, algorithms, and the like, that provide the functionality of the controller 130. By way of example, the memory 204 may store an operating system 208, application programs 210, program data 212, and the like. In this regard, the memory 204 may be implemented as a combination of volatile and non-volatile memory, such as DRAM, EEPROM, MRAM, flash memory, and the like. In addition, or alternatively, the memory 204 may comprise a device configured to read from and write to a removable media, such as, a floppy disk, a CD-ROM, a DVD-ROM, or other optical or magnetic media.

The memory 204 may also store a correlation determination module 214, which the controller 130 may implement to perform various functions with respect to correlating the sensors 120a–120n with the CRAC units 114a–114n. More particularly, for instance, the correlation determination module 214 may be implemented to determine the CRAC unit 114a–114n families to which the sensors 120a–120n are assigned.

Also included in the memory 204 is a data storage module 216. The data storage module 216 may be implemented to store various data received from the CRAC units 114a–114n and the sensors 120a–120n. For instance, the data storage module 216 may store the received data in a data storage location in the memory 204. In addition, the data storage module 216 may be implemented to store the correlations between the sensors 120a–120n and the CRAC units 114a–114n. The data storage module 216 may store this correlation information in a variety of different manners. For instance, the data storage module 216 may store the information in the form of a look-up table. In addition, or alternatively, the data storage module 216 may store the information in the form of a map that may be employed to visualize the positions of the sensors 120a–120n and the families 132a–132n to which they are related.

Instructions from the controller 130 may be transmitted over a network 220 that operates to couple the various components of the sensor commissioning system 202. Although not shown, the controller 130 may be equipped with or have access to software and/or hardware to enable the controller 130 to transmit and receive data over the network 220. The network 220 generally represents a wired or wireless structure in the data center 100 for the transmission of data between the various components of the sensor commissioning system 202. The network 220 may comprise an existing network infrastructure or it may comprise a separate network configuration installed for the purpose of sensor commissioning by the controller 130.

The sensors 120a–120n may be configured to transmit collected data over the network 220 for storage and processing. As stated above, the sensors 120a–120n may comprise sensors configured to detect at least one environmental condition at various locations in the data center 100. The at least one environmental condition may comprise temperature, absolute humidity, or pressure and the sensors 120a–120n may be configured to detect at least one of these conditions. In addition, the controller 130 may vary operations of the correlation determination module 214 according to the type of environmental condition detected.

The controller 130 may transmit instructions over the network 220 to the CRAC units 114a–114n to vary operations of the CRAC units 114a–114n. As shown, the CRAC units 114a–114n each include an actuator A 222 and an actuator B 224. The actuators 222 and 224 generally comprise devices for controlling different aspects of the airflow supplied by the CRAC units 114a–114n, which are also actuators. More particularly, the CRAC units 114a–114n may be considered as primary actuators and the actuators 222 and 224 may be considered as secondary actuators.

By way of example, the actuators 222 may comprise airflow volume varying devices, such as, variable frequency drives (VFDs), fans, blowers, etc. Generally speaking, VFDs comprise actuators configured to vary the speeds at which the fans or blowers operate to thereby control the airflow volume supplied by the CRAC units 114a–114n. In addition, the actuators 224 may comprise airflow temperature varying devices, such as, water-chillers, compressors, valves, etc. Alternatively, the actuators 224 may comprise humidity varying-devices, such as, humidifiers and dehumidifiers. As described in greater detail herein below, the controller 130 may control the actuators 222 and 224 of the CRAC units 114a–114n to vary one or more characteristics of the airflow detected by the sensors 120a–120n. The conditions detected by the sensors 120a–120n at the various CRAC unut 114a–114n settings may be employed to commission the sensors 120a–120n with respect to the CRAC units 114a–114n.

In this regard, the CRAC units 114a–114n may include respective interfaces (not shown) that generally enable data transfer between the CRAC units 114a–114n and the controller 130 over the network 220. The interfaces may comprise any reasonably suitable hardware and/or software capable to enabling the data transfer over the network 220.

Figure 3:
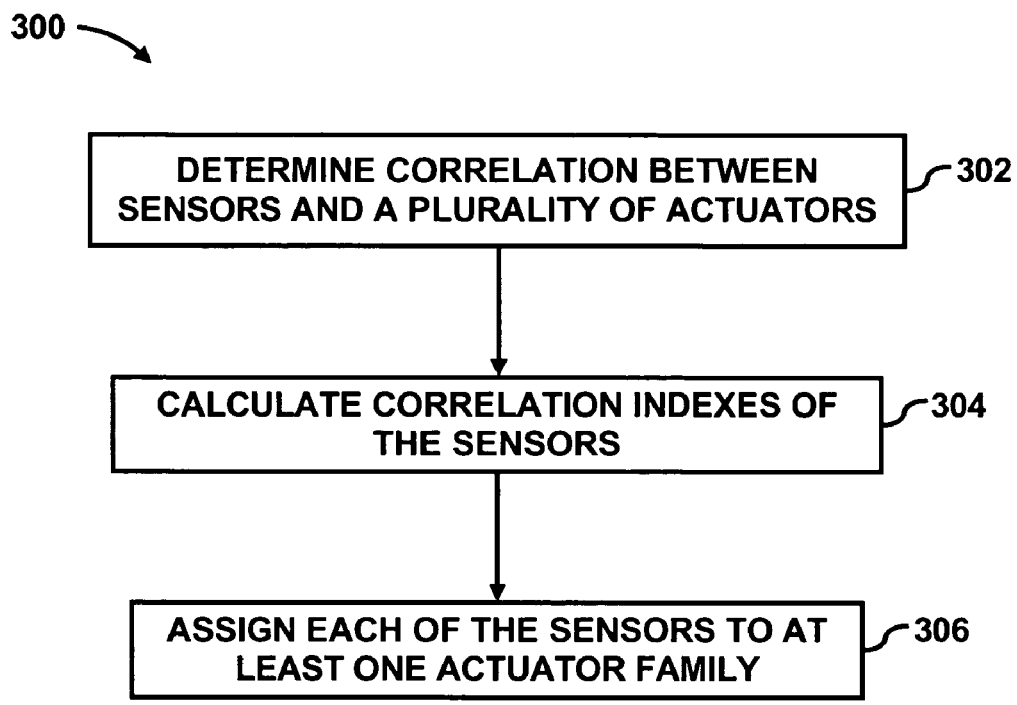
FIG. 3 illustrates a flow diagram of an operational mode of a method for commissioning sensors, according to an embodiment of the invention.

FIG. 3 illustrates a flow diagram of an operational mode 300 of a method for commissioning sensors, according to an example. It is to be understood that the following description of the operational mode 300 is but one manner of a variety of different manners in which an example of the invention may be practiced. It should also be apparent to those of ordinary skill in the art that the operational mode 300 represents a generalized illustration and that other steps may be added or existing steps may be removed, modified or rearranged without departing from a scope of the operational mode 300.

The description of the operational mode 300 is made with reference to the block diagram 200 illustrated in FIG. 2, and thus makes reference to the elements cited therein. It should, however, be understood that the operational mode 300 is not limited to the elements set forth in the block diagram 300. Instead, it should be understood that the operational mode 300 may be practiced by a sensor commissioning system having a different configuration than that set forth in the block diagram 200.

The operational mode 300 may be implemented to commission the sensors 120a–120n with respect to a plurality of actuators, for instance, CRAC units 114a–114n. More particularly, the operational mode 300 may be implemented to relate the sensors 120a–120n to the actuators. In addition, those sensors 120a–120n that are influenced to a predefined level by a particular actuator are considered to be within that actuator's family.

Figure 4A:
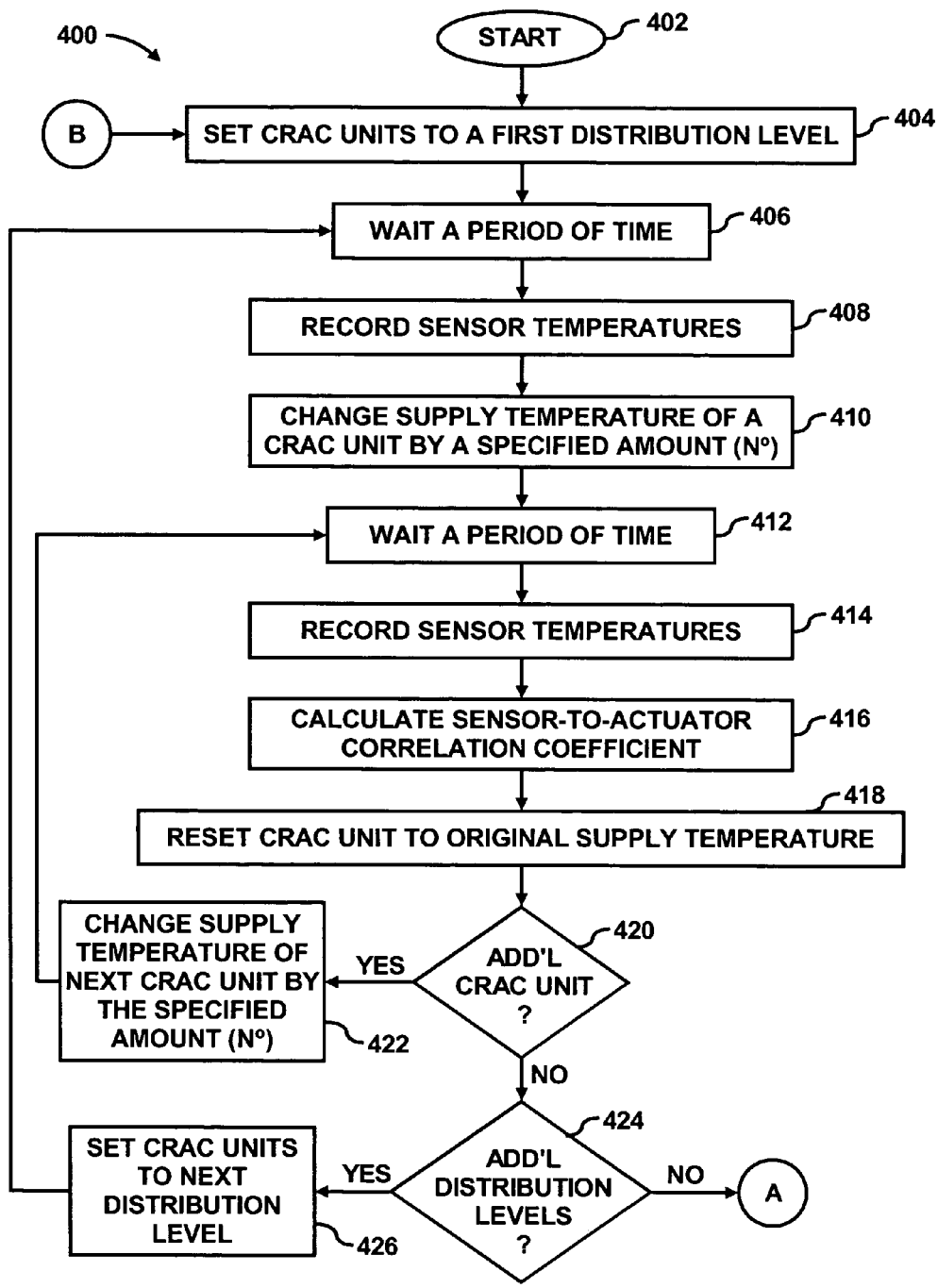
FIG. 4A illustrates a flow diagram of an operational mode of a method for commissioning temperature sensors, according to an embodiment of the invention.

In the operational mode 300, the controller 130 may determine correlations between the sensors 120a–120n and a plurality of actuators at step 302. Manners in which these correlations may be determined are described in greater detail herein below with respect to the operational modes 400 (FIG. 4A), 600 (FIG. 6), and 700 (FIG. 7). The controller 130 may also calculate correlation indexes of the sensors 120a–120n, which are functions of the plurality of actuator settings and a particular actuator, from the correlations at step 304. Examples of how the correlation indexes of the sensors 120a–120n may be calculated are described in greater detail herein below with respect to the operational modes 450 (FIG. 4B) and 470 (FIG. 4C). In addition, the controller 130 may assign each of the sensors 120a–120n to at least one actuator family at step 306. Again, a more detailed description of this step is provided below with respect to the operational modes 450 (FIG. 4B) and 470 (FIG. 4C).

With particular reference now to FIG. 4A, there is shown a flow diagram of an operational mode 400 of a method for commissioning sensors, according to an example. It is to be understood that the following description of the operational mode 400 is but one manner of a variety of different manners in which an embodiment of the invention may be practiced. It should also be apparent to those of ordinary skill in the art that the operational mode 400 represents a generalized illustration and that other steps may be added or existing steps may be removed, modified or rearranged without departing from a scope of the operational mode 400.

The operational mode 400 may be implemented to commission the sensors 120a–120n in a data center 100. More particularly, the operational mode 400 may be implemented to relate the sensors 120a–120n to the CRAC units 114a–114n. In addition, those sensors 120a–120n that are influenced to a predefined level by a particular CRAC unit 114a–114n are considered to be within that CRAC unit's 114a–114n family.

The operational mode 400 may be initiated at step 402 in response to any of a number of stimuli or conditions. For instance, the operational mode 400 may be initiated with activation of the components in the data center 100, such as, the CRAC units 114a–114n. In addition, or alternatively, the operational mode 400 may be manually initiated or the controller 130 may be programmed to initiate the operational mode 400 at various times, for a set duration of time, substantially continuously, etc.

Once initiated, the controller 130 may set the CRAC units 114a–114n to a first distribution level at step 404. The first distribution level may comprise a first flow rate (VFD setting) and temperature of the airflow supplied by the CRAC units 114a–114n, which are common for the CRAC units 114a–114n. In addition, the controller 130 may wait for a period of time at step 406, prior to recording temperature information received from the sensors 120a–120n at step 408. The controller 130 may allow this time period to elapse in order to enable a relatively steady-state of operation to be reached. The time period may be based upon, for instance, the loading on the CRAC units 114a–114n. In addition, during the time period at step 406, the controller 130 may determine a median temperature reading for one or more of the sensors 120a–120n in the event that the temperatures detected by one or more of the sensors 120a–120n oscillate during the time period. In this case, the temperature measurements recorded at step 408 may comprise time-averaged values.

Following elapse of the time period at step 406, the controller 130 may record the temperature measurements obtained by the sensors 120a–120n, as indicated at step 408. As stated above, the temperature information may be stored through implementation of the data storage module 216. The controller 130 may instruct a CRAC unit 114a to change the temperature of the airflow by a specified amount (N°) at step 410. The specified amount (N°) may comprise an amount that differs from the first distribution level temperature by a relatively discernable amount. Thus, for instance, the specified amount (N°) may range from, for instance, ±1° C. to 20° C. or more. The CRAC unit 114a may change the temperature of the airflow by the specified amount (N°) through, for instance, varying operations of the actuator B 224, which may comprise a compressor, a chiller, a valve, etc.

The controller 130 may again wait for a period of time at step 412, prior to recording temperature information received from the sensors 120a–120n at step 414. The controller 130 may allow this time period to elapse in order to enable a relatively steady-state of operation to be reached following the supply air temperature change in the CRAC unit 114a. Following elapse of the time period at step 412, the controller 130 may again record the temperature measurements obtained by the sensors 120a–120n, as indicated at step 414. In addition, during the time period at step 412, the controller 130 may determine a median temperature reading for one or more of the sensors 120a–120n in the event that the temperatures detected by one or more of the sensors 120a–120n oscillate during the time period. In this case, the temperature measurements recorded at step 412 may comprise time-averaged values.

At step 416, the controller 130 may calculate a sensor-to-actuator correlation coefficient ($C_i$) for the sensors 120a–120n (i). The actuators are the CRAC units 114a–114n. As such, the correlation coefficient ($C_i$) is a function of the relative level of influence the CRAC units 114a–114n have over the sensors 120a–120n. Thus, for instance, the higher the correlation coefficient ($C_i$) value for a sensor 120a–120n, the greater the influence a CRAC unit 114a–114n has over that sensor 120a–120n. In addition, the calculated correlation coefficients ($C_i$) for the CRAC units 114a–114n and the sensors 120a–120n may be stored in the memory 204.

Although the correlation coefficients ($C_i$) may be determined through any number of suitable correlation algorithms, the following algorithm may be employed to calculate the correlation coefficients ($C_i$) of the sensors 120a–120n.

$$\text{Equation (1): } C_i = \frac{(T_1 - T_2)}{N}.$$

In Equation (1), $T_1$ is the temperature measurement recorded at step 408 and $T_2$ is the temperature measurement recorded at step 414. In addition, N is the specified amount of supply air temperature change for the CRAC unit 114a at step 410.

By way of example, if the temperature of the sensor 120a recorded at step 408 ($T_1$) is 20° C., the temperature of the sensor 120a recorded at step 414 ($T_2$) is 25° C., and the change in temperature of the supply air (N) is +10° C., the correlation coefficient ($C_i$) between the sensor 120a and the CRAC unit 114a is 0.5. As another example, if the temperature of the sensor 120b recorded at step 408 ($T_1$) is 20° C., the temperature of the sensor 120b recorded at step 414 ($T_2$) is 21° C., and the change in temperature of the supply air (N) is +10° C., the correlation coefficient ($C_i$) between the sensor 120b and the CRAC unit 114a is 0.10. As such, the sensor 120a has a greater correlation to the CRAC unit 114a. Thus, changes to the supplied airflow from the CRAC unit 114a are likely to have a greater impact on conditions at the sensor 120a as compared with the sensor 120b.

At step 418, the temperature of the CRAC unit 114a may be reset to the temperature at the first distribution level set at step 404. In addition, it may be determined whether correlations between other CRAC units 114b–114n and the sensors 120a–120b are to be made at step 420. If it is determined that additional correlations are to be determined, the temperature of the airflow supplied by a next CRAC unit 114b may be varied by the specified amount (N°) at step 422. The temperature of the airflow supplied by the CRAC unit 114b may be varied in manners as described herein above with respect to step 410.

Following step 422, the controller 130 may again wait for a period of time at step 412, prior to recording temperature information received from the sensors 120a–120n at step 414, as described above. In addition, the controller 130 may calculate a sensor-to-actuator correlation coefficient ($C_i$) for the sensors 120a–120n (i) and the CRAC unit 114b at step 416, as also described above. Moreover, the temperature of the CRAC unit 114b may be reset to the temperature at the first distribution level set at step 404.

Steps 412–422 may be repeated for the remaining CRAC units 114c–114n. In this regard, the correlations between all of the CRAC units 114a–114n and the sensors 120a–120n may be determined and recorded.

If there are no further CRAC units 114a–114n for which correlations to the sensors 120a–120n are to be determined, it may be determined as to whether correlations are to be determined at an additional distribution level at step 424. If "yes", the CRAC units 114a–114n may be set to a next distribution level at step 426. The next distribution level may comprise characteristics that differ from the first distribution level. As such, either or both of the flow rate and the temperature of the cooled airflow supplied by the CRAC units 114a–114n may differ from their settings in the first distribution level.

As shown, following step 426, steps 406–424 may be repeated to calculate and record the correlations between the sensors 120a–120n and the CRAC units 114a–114n at the next distribution level. In addition, step 426, and steps 406–424, may be repeated for a number of different distribution levels. For instance, these steps may be repeated for a predetermined number of iterations, where the predetermined number of iterations may be chosen according to the desired size of the sensor-to-actuator correlations. In addition, or alternatively, these steps may be repeated for a predetermined period of time. In any regard, once the correlation data has been recorded and no further data is to be collected at different distribution levels, the collected data may be processed in either of two examples, as indicated by the identifier "A".

The first example is illustrated in the flow diagram of an operational mode 450 illustrated in FIG. 4B. As shown in FIG. 4B, following a "no" condition at step 424, the correlation data collected at step 416 for the various distribution levels and CRAC unit 114a–114n settings are fed into a neural network teaching algorithm, as indicated at step 452. The neural network teaching algorithm may, for instance, comprise the correlation determination module 214 depicted in FIG. 2. In addition, the correlation coefficients ($C_i$) may be used to teach the neural network of the initial relationships between the CRAC unit 114a–114n settings and the conditions detected by the sensors 120a–120n. The neural network may use the initial relationships to estimate correlation coefficients ($C_i$) relating to various CRAC unit 114a–114n settings as described in greater detail herein below.

Figure 5:
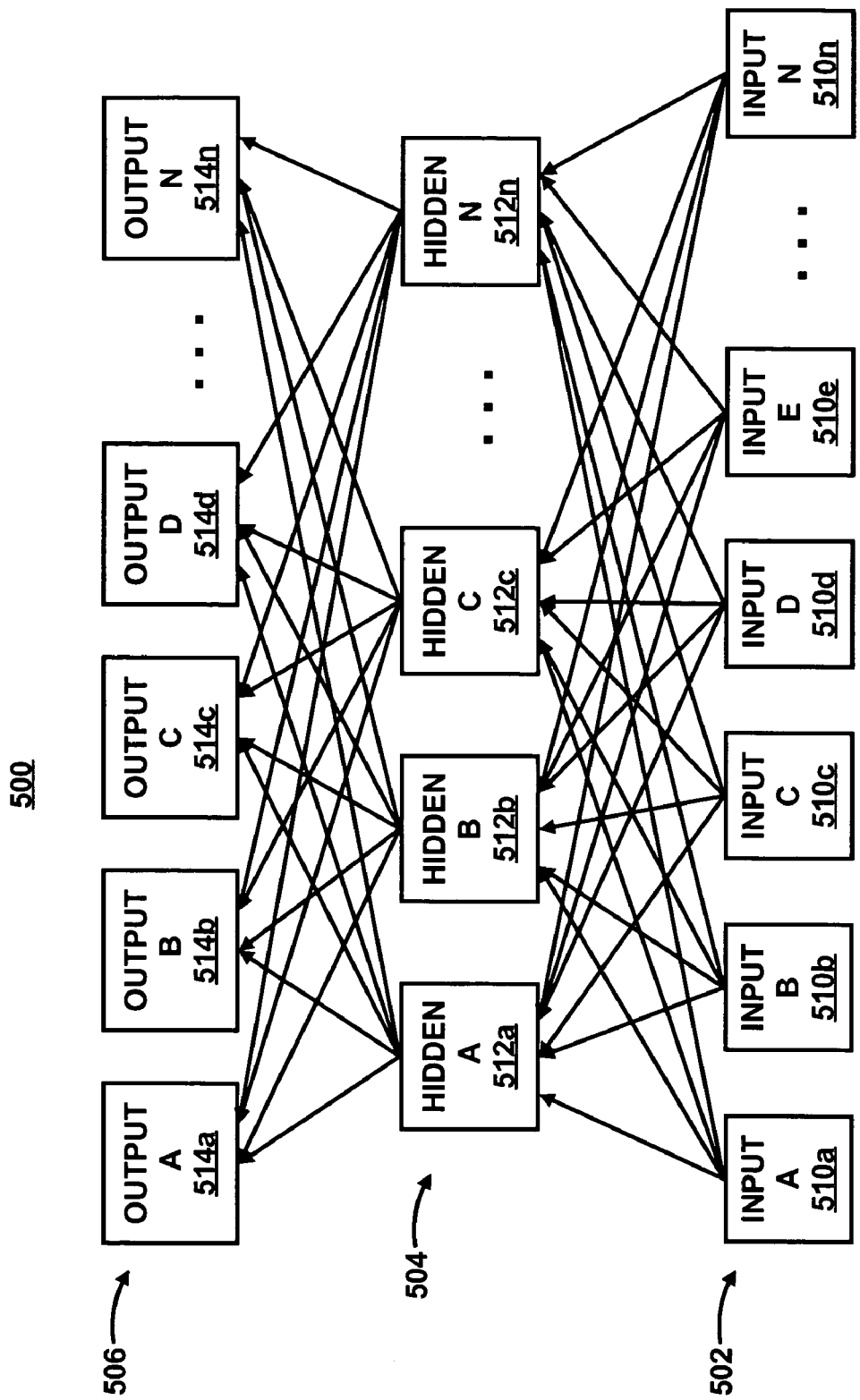
FIG. 5 shows a example of a neural network created through implementation of the operational mode depicted in FIG. 4B, according to an embodiment of the invention.

The neural network teaching algorithm may be implemented to generate a neural network as indicated at step 454. A diagram of a neural network 500 generated at step 454, according to an example, is also illustrated in FIG. 5. As shown in FIG. 5, the neural network 500 includes an input layer 502, a hidden layer 504, and an output layer 506. The input layer 502 includes input neurons A–N 510a–510n, the hidden layer 504 includes hidden neurons A–N 512a–512n, and the output layer 506 includes output neurons A–N 514a–514n, where "n" is an integer greater than one. The ellipses " . . . " positioned between various neurons in the neural network 500 generally indicate that the neural network 500 may include any reasonably suitable number of additional neurons.

The input neurons 510a–510n may represent CRAC unit 114a–114n setpoints of the neural network 500, and may comprise, for instance, volume flow rates of the airflow supplied by the CRAC units 114a–114n (VFD speeds), CRAC unit 114a–114n supply temperatures, etc. The output neurons 514a–514n may comprise correlation coefficients ($C_i$) of the sensors 120a–120n. The correlation coefficients ($C_i$) may be fed into the neural network teaching algorithm to teach the neural network 500 of the initial relationships between the CRAC unit 114a–114n setpoints and the correlation coefficients ($C_i$) the sensors 120a–120n. In this regard, the output neurons 514a–514n may comprise the correlation coefficients ($C_i$) determined at step 416, which the teaching algorithm may implement to generate neural network 500.

In addition, based upon the initial relationships between the CRAC unit (i) setpoints ($X_i$) and the correlation indexes ($Y_j$) for the sensors (i), the neural network 500 may determine weights ($W_{ij}$) between the CRAC unit (i) setpoints ($X_i$) and the correlation indexes ($Y_j$). The weights, which are assigned to each interaction, may be randomly selected and modified to reduce the mean square error as the learning epoch proceeds. In addition, the relationships between various CRAC unit (i) setpoints ($X_i$) and correlation coefficients ($Y_j$) for the sensors (j) may be defined by the following equation:

$$Y_j = \text{Sum}(W_{ij} * X_i + B_j), \text{ for all the CRAC units (i).} \quad \text{Equation (2):}$$

In Equation (2), $B_j$ are offsets of the correlation coefficients ($Y_j$). Equation (2) may be employed in the neural network 500 to determine the correlation coefficients ($Y_j$) that correspond to various CRAC unit (i) setpoints, which were not fed into the neural network 500 at step 452.

In addition, the number of neurons 510a–510n, 512a–512n, and 514a–514n per layer 502–506 may be modified to increase the accuracy of the neural network model depicted in FIG. 5. By way of example, the number of hidden neurons 512a–512n may be increased to thereby increase the complexity in the relationship between the input neurons 510a–510n and the output neurons 514a–514n. The final model may comprise layers 502–506 of neurons 510a–510n, 512a–512n, and 514a–514n with weights and connections with associated biases that link up the input neurons 510a–510n to the output neurons 514a–514n. In one respect, therefore, the neural network 500 may be employed to determine the correlation coefficients ($C_i$) of the sensors 120a–120n that were not determined through implementation of the method 400. In this regard, for instance, the neural network 500 may be capable of interpolating correlation coefficients ($C_i$) for various CRAC unit 114a–114n setpoints.

Referring back to FIG. 4B, at step 456, correlation indexes ($C_{i,j,k}$) of the sensors 120a–120n may be determined from the neural network 500 generated at step 454. The correlation indexes ($C_{i,j,k}$) for the sensors 120a–120n may broadly be defined as functions of the VFD speeds for a plurality of CRAC units 114a–114n and a particular CRAC unit 114a. The function may be in the form of:

$$C_{i,j,k} = F(VFD_1, VFD_2, \ldots, VFD_n, CRAC_k), \quad \text{Equation (3):}$$

where $C_{i,j,k}$ is the correlation index for the sensor (i), $VFD_1 \ldots VFD_n$ are various VFD setpoints (j) for the CRAC units 114a–114n, and the $CRAC_k$ refers to a particular CRAC unit (k).

At step 458, the correlation indexes ($C_{i,j,k}$) of the sensors 120a–120n may be compared to a predefined threshold value. The predefined threshold may be based upon an infrastructure efficiency as determined, for instance, by an average value for the correlation coefficients. A high average value of correlation coefficients generally represents an efficient infrastructure, whereas a low average value of correlation coefficients represents a less efficient infrastructure. In any event, it may be determined as to which of the correlation indexes ($C_{i,j,k}$) exceed the predefined threshold value at step 458. For those correlation indexes ($C_{i,j,k}$) that exceed the predefined threshold value, the associated sensor (i) may be assigned to the particular CRAC unit (k) for the VFD setpoints (j) contained in the function of Equation (3) at step 460. In addition, the correlation indexes ($C_{i,j,k}$) for a particular sensor (i) may vary with varying thermal management requirements or varying VFD setpoints (j). In other words, the correlations between any sensor (i) and any CRAC unit (k) are functions of the VFD setpoints (j). Thus, although a sensor (i) may be strongly correlated with a CRAC unit (k) for a particular set of VFD setpoints (j), the same sensor (i) may not be strongly correlated with the same CRAC unit (k) at a different set of VFD setpoints (j).

The remaining sensors 120a–120n may either be assigned to respective CRAC unit 114a–114n families based upon these criteria. In addition, the sensors 120a–120n may belong to multiple families for any given set of VFD setpoints (j). The correlating information regarding the CRAC unit 114a–114n families and their associated sensors 120a–120n may be stored, for instance, in a look-up table, in a map, etc.

The sensors 120a–120n may be assigned to respective CRAC units 114a–114n through implementation of the operational modes 400 and 450, thereby commissioning the sensors 120a–120 with respect to the CRAC units 114a–114n in a data center 100. The commissioning process depicted in the operational modes 400 and 450 may include additional steps. For instance, data may be historically logged and periodically fed to the neural network teaching algorithm to update the CRAC unit 114a–114n families. This data may also be used to refine the estimates determined by the neural network 500, such as, for instance, in the event that an initial commissioning process utilized a relatively limited number of VFD settings to, for instance, reduce the time required to perform the initial commissioning process.

Following either or both of steps 458 and 460, it may be determined as to whether the operational modes 400 and 450 are to continue at step 462. The determination of whether to continue the operation modes 400 and 450 may be based upon whether it is desired to, for instance, commission the sensors 120a–120n on an ongoing basis. Thus, for instance, the operational modes 400 and 450 may be continued at step 462 to substantially continuously update the CRAC unit 114a–114n families. If a "yes" condition is reached at step 462, the operational modes 400 and 450 may be repeated beginning at step 404. If, however, a "no" condition is reached at step 462, the operational modes 400 and 450 may end as indicated at step 464.

The second example is illustrated in the flow diagram of an operational mode 470 illustrated in FIG. 4C. As shown in FIG. 4C, following a "no" condition at step 424, the correlation data collected at step 416 for the various distribution levels and CRAC unit 114a–114n settings are fed into a curve fitting algorithm, as indicated at step 472. The curve fitting algorithm may, for instance, comprise the correlation determination module 214 depicted in FIG. 2. In addition, the curve fitting algorithm may comprise any reasonably suitable, traditional curve fitting algorithm used to fit a multi-variant, polynomial function to the data set that defines the correlation index ($C_{i,j,k}$).

The curve fitting algorithm may be implemented to determine the correlation indexes ($C_{i,j,k}$) for the sensors 120a–120n at step 474. Although a number of various equations may be employed, an example of a polynomial function for two CRAC units 114a–114b may be represented as follows:

$$\text{Equation (4):} \quad C_{i,j,k} = \sum_{m=0}^{M} \sum_{n=0}^{M} a_l VFD_m VFD_n,$$

where i is the sensor 120a–120n number, j is the CRAC unit 114a–114n distribution set, k is the CRAC unit 114a–114n number, and $\alpha_i$ is a coefficient. The summation in Equation (4) may be expanded to determine the correlation indexes ($C_{i,j,k}$) with additional CRAC units 114a–114n. In any regard, the data from the CRAC unit 1114a–114n distribution set (j) may be used to define the coefficients $\alpha_1$ of Equation (4). Although not shown, a filtering process may be performed following step 416 to reduce the number of CRAC units 114a–114n to consider for various sensors 120a–120n. More particularly, for instance, those CRAC units 114a–114n having a relatively limited effect on a sensor 120a may be removed from the calculation of the coefficients ($\alpha$), as described, for instance, with respect to step 814 in FIG. 8 below.

In addition, an equation representing the multi-variant, polynomial function may be implemented for each of the sensors 120a–120n. In addition, the equation may be used to calculate the coefficients (a) for each of the sensors 120a–120n. A standard statistical regression method, for instance, through software configured to perform the standard statistical regression method, such as, MATLAB, MS EXCEL, MATHEMATICA, and the like, may be employed to calculate the coefficients (a), with the remaining inputs of the equation having been determined through implementation of the operational mode 400.

At step 476, the correlation indexes ($C_{i,j,k}$) of the sensors 120a–120n may be compared to a predefined threshold value. The predefined threshold value may be based upon an infrastructure efficiency as determined, for instance, by an average value for the correlation coefficients. A high average value generally represents an efficient infrastructure, whereas a low average value represents a less efficient infrastructure. In any event, it may be determined as to which of the correlation indexes ($C_{i,j,k}$) exceed the predefined threshold value at step 476. For those correlation indexes ($C_{i,j,k}$) that exceed the predefined threshold value, the associated sensor (i) may be assigned to the particular CRAC unit (k) for the VFD setpoints (j) contained in the function of Equation (3) at step 478. In addition, the correlation indexes ($C_{i,j,k}$) for a particular sensor (i) may vary with varying thermal management requirements or varying VFD setpoints (j). In other words, the correlations between any sensor (i) and any CRAC unit (k) are functions of the VFD setpoints (j). Thus, although a sensor (i) may be strongly correlated with a CRAC unit (k) for a particular set of VFD setpoints (j), the same sensor (i) may not be strongly correlated with the same CRAC unit (k) at a different set of VFD setpoints (j).

The remaining sensors 120a–120n may either be assigned to respective CRAC unit 114a–114n families based upon these criteria. In addition, the sensors 120a–120n may belong to multiple families for any given set of VFD setpoints (j). The correlating information regarding the CRAC unit 114a–114n families and their associated sensors 120a–120n may be stored, for instance, in a look-up table, in a map, etc.

The sensors 120a–120n may be assigned to respective CRAC units 114a–114n through implementation of the operational modes 400 and 470, thereby commissioning the sensors 120a–120 with respect to the CRAC units 114a–114n. Following either or both of steps 476 and 478, it may be determined as to whether the operational modes 400 and 470 are to continue at step 480. The determination of whether to continue the operation modes 400 and 470 may be based upon whether it is desired to, for instance, commission the sensors 120a–120n on an ongoing basis. Thus, for instance, the operational modes 400 and 470 may be continued at step 480 to substantially continuously update the CRAC unit 114a–114n families. If a "yes" condition is reached at step 480, the operational modes 400 and 470 may be repeated beginning at step 404. If, however, a "no" condition is reached at step 480, the operational modes 400 and 470 may end as indicated at step 484.

As stated above, the operational mode 400 is but one manner of a variety of different manners in which the sensors 120a–120n may be commissioned. The following descriptions of the operational modes 600 and 700 are alternative manners in which the sensors 120a–120n may be commissioned. In the operational mode 600, relative pressure is detected by the sensors 120a–120n and the commissioning process is based upon the detected relative pressures. In the operational mode 700, absolute humidity is detected by the sensors 120a–120n and the commissioning process is based upon the detected absolute humidities.

Figure 6:
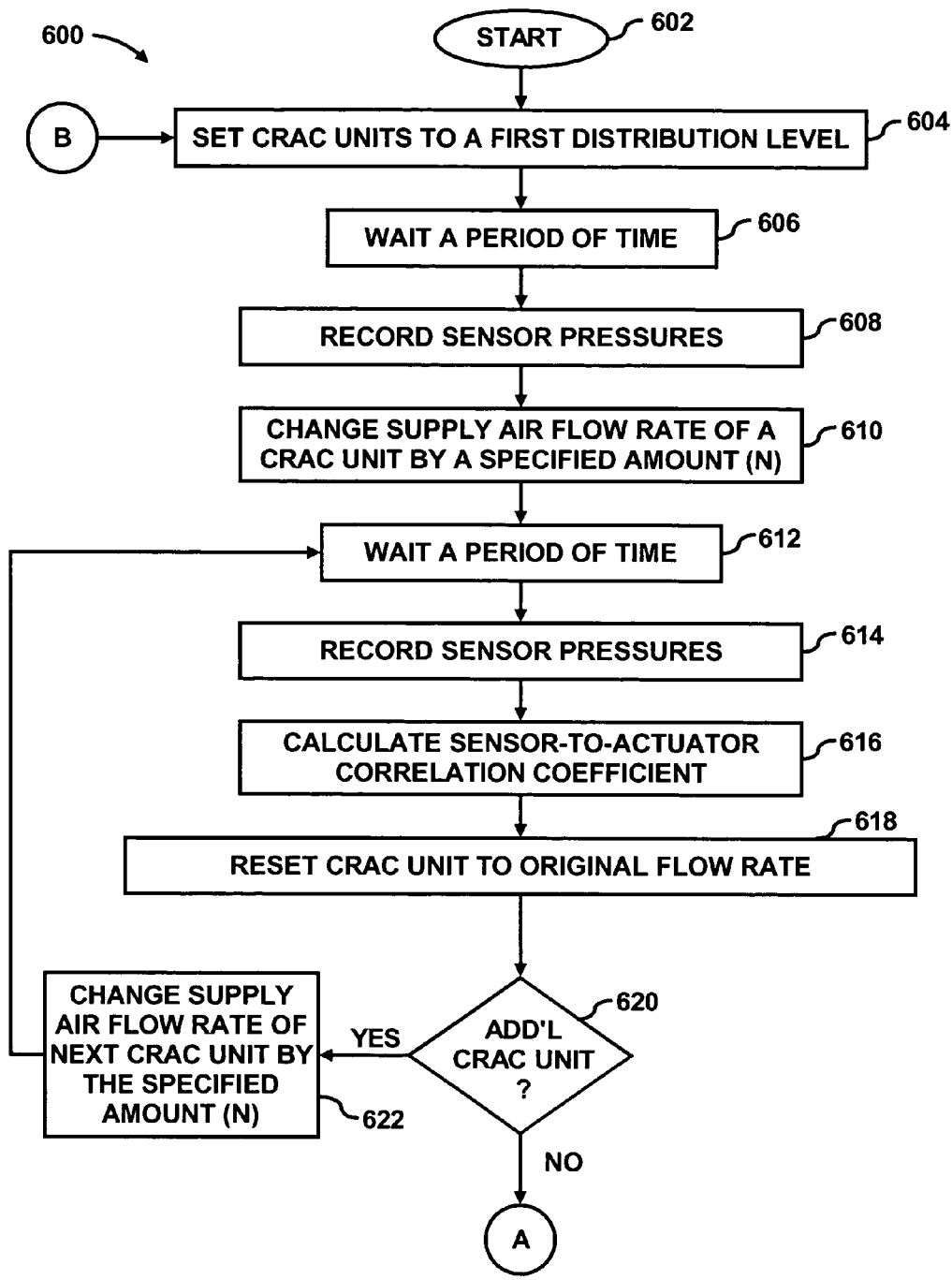
FIG. 6 illustrates a flow diagram of an operational mode for commissioning pressure sensors, according to an embodiment of the invention.
Figure 7:
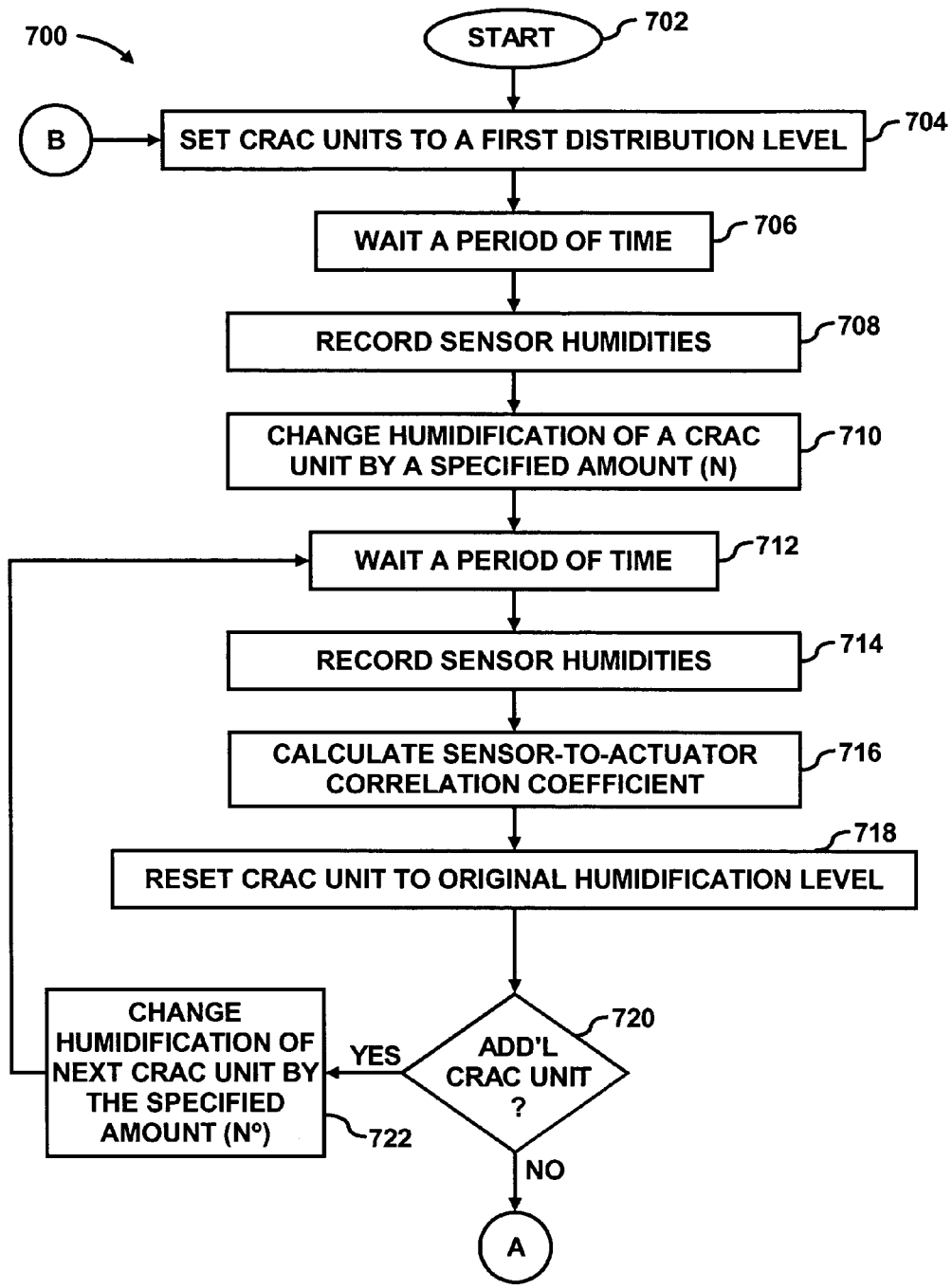
FIG. 7 illustrates a flow diagram of an operational mode for commissioning humidity sensors, according to an embodiment of the invention.

With reference first to FIG. 6, there is shown a flow diagram of the operational mode 600 for commissioning sensors 114a–114n through use of pressure sensors. It should also be apparent to those of ordinary skill in the art that the operational mode 600 represents a generalized illustration and that other steps may be added or existing steps may be removed, modified or rearranged without departing from a scope of the operational mode 600.

The operational mode 600 may be initiated at step 602 in manners similar to those described above with respect to step 402 (FIG. 4A). Once initiated, the controller 130 may set the CRAC units 114a–114n to a first distribution level at step 604. The first distribution level may comprise a first flow rate (VFD setting) and temperature of the airflow supplied by the CRAC units 114a–114n, which are common for the CRAC units 114a–114n. In addition, the controller 130 may wait for a period of time at step 606, prior to recording relative pressure information received from the sensors 120a–120n at step 608. The controller 130 may allow this time period to elapse in order to enable a relatively steady-state of operation to be reached. The time period may be based upon, for instance, the loading on the CRAC units 114a–114n. In addition, during the time period at step 606, the controller 130 may determine a median relative pressure reading for one or more of the sensors 120a–120n in the event that the relative pressures detected by one or more of the sensors 120a–120n oscillate during the time period. In this case, the relative pressure measurements recorded at step 608 may comprise time-averaged values.

Following elapse of the time period at step 606, the controller 130 may record the relative pressure measurements obtained by the sensors 120a–120n, as indicated at step 608. The relative pressure information may be stored through implementation of the data storage module 216. The controller 130 may instruct a CRAC unit 114a to change the flow rate of the airflow by a specified amount (N) at step 610. The flow rate of the airflow may be varied through, for instance, varying the speed of the VFD controlling the blower or fan of the CRAC unit 114a.

The controller 130 may again wait for a period of time at step 612, prior to recording relative pressure information received from the sensors 120a–120n at step 614. The controller 130 may allow this time period to elapse to enable a relatively steady-state of operation to be reached following the supply air flow rate change in the CRAC unit 114a. Following elapse of the time period at step 612, the controller 130 may again record the relative pressure measurements obtained by the sensors 120a–120n, as indicated at step 614. In addition, during the time period at step 612, the controller 130 may determine a median relative pressure reading for one or more of the sensors 120a–120n in the event that the relative pressures detected by one or more of the sensors 120a–120n oscillate during the time period. In this case, the relative pressure measurements recorded at step 612 may comprise time-averaged values.

At step 616, the controller 130 may calculate a sensor-to-actuator correlation coefficient ($C_i$) for the sensors 120a–120n (i). As also described above, the actuators are the CRAC units 114a–114n. As such, the correlation coefficient ($C_i$) is a function of the relative level of influence the CRAC units 114a–114n have over the sensors 120a–120n. Thus, for instance, the higher the correlation coefficient ($C_i$) value for a sensor 120a–120n, the greater the influence a CRAC unit 114a–114n has over that sensor 120a–120n. In addition, the calculated correlation coefficients ($C_i$) for the CRAC units 114a–114n and the sensors 120a–120n may be stored in the memory 204.

Although the correlation coefficient ($C_i$) may be determined through any number of suitable correlation algorithms, the following algorithm may be employed to calculate the correlation coefficients ($C_i$) of the sensors 120a–120n.

$$\text{Equation (5):} \quad C_i = \frac{(RP_1 - RP_2)}{N}.$$

In Equation (5), $RP_1$ is the relative pressure measurement recorded at step 608 and $RP_2$ is the relative pressure measurement recorded at step 614. In addition, N is the static pressure at the supply of a CRAC unit 114a. The static pressure N may be measure directly at the supply of the CRAC unit 114a or it may be read from the effective fan curve for the CRAC unit 114a for a give supply air flow rate.

At step 618, the supply airflow rate of the CRAC unit 114a may be reset to the flow rate at the first distribution level set at step 604. In addition, it may be determined whether correlations between other CRAC units 114b–114n and the sensors 120a–120b are to be made at step 620. If it is determined that additional correlations are to be determined, the supply airflow rate of a next CRAC unit 114b may be varied by the specified amount (N) at step 622. The supply air flow rate of the airflow supplied by the CRAC unit 114b may be varied in manners as described herein above with respect to step 610.

Following step 622, the controller 130 may again wait for a period of time at step 612, prior to recording relative pressure information received from the sensors 120a–120n at step 614, as described above. In addition, the controller 130 may calculate a sensor-to-actuator correlation coefficient ($C_i$) for the sensors 120a–120n (i) and the CRAC unit 114b at step 616, as also described above. Moreover, the supply air flow rate of the CRAC unit 114b may be reset to the temperature at the first distribution level set at step 604.

Steps 612–622 may be repeated for the remaining CRAC units 114c–114n. In this regard, the correlations between all of the CRAC units 114a–114n and the sensors 120a–120n may be determined and recorded through implementation of the operational mode 600.

If there are no further CRAC units 114a–114n for which correlations to the sensors 120a–120n are to be determined, the collected data may be processed in either of two examples, as indicated by the identifier "A". The collected data may be processed to assign the sensors 120a–120n to one or more CRAC unit 114a–114n families in manners described hereinabove with respect to FIGS. 4B, 4C and 5. Therefore, a detailed explanation of this process is omitted.

With reference now to FIG. 7, there is shown a flow diagram of the operational mode 700 for commissioning sensors 114a–114n through use of humidity sensors. It should also be apparent to those of ordinary skill in the art that the operational mode 700 represents a generalized illustration and that other steps may be added or existing steps may be removed, modified or rearranged without departing from a scope of the operational mode 700.

The operational mode 700 may be initiated at step 702 in manners similar to those described above with respect to step 402 (FIG. 4A). Once initiated, the controller 130 may set the CRAC units 114a–114n to a first distribution level at step 704. The first distribution level may comprise a first flow rate (VFD setting) and temperature of the airflow supplied by the CRAC units 114a–114n, which are common for the CRAC units 114a–114n. The first distribution level may also include a first humidification or dehumidification setting of the actuators 224.

The controller 130 may wait for a period of time at step 706, prior to recording absolute humidity (the amount of water vapor present in a unit volume of air), information received from the sensors 120a–120n at step 708. The controller 130 may allow this time period to elapse in order to enable a relatively steady-state of operation to be reached. The time period may be based upon, for instance, the loading on the CRAC units 114a–114n. In addition, during the time period at step 706, the controller 130 may determine a median absolute humidity reading for one or more of the sensors 120a–120n in the event that the absolute humidities detected by one or more of the sensors 120a–120n oscillate during the time period. In this case, the absolute humidity measurements recorded at step 708 may comprise time-averaged values.

Following elapse of the time period at step 706, the controller 130 may record the absolute humidity measurements obtained by the sensors 120a–120n, as indicated at step 708. The absolute humidity information may be stored through implementation of the data storage module 216. The controller 130 may instruct a CRAC unit 114a to change the humidification (or dehumidification) by a specified amount (N) at step 710. The humidification (or dehumidification) may be varied through, for instance, a change in the operation of the actuator 224 of the CRAC unit 114a.

The controller 130 may again wait for a period of time at step 712, prior to recording absolute humidity information received from the sensors 120a–120n at step 714. The controller 130 may allow this time period to elapse to enable a relatively steady-state of operation to be reached following the humidification (or dehumidification) change in the CRAC unit 114a. Following elapse of the time period at step 712, the controller 130 may again record the absolute humidity measurements obtained by the sensors 120a–120n, as indicated at step 714. In addition, during the time period at step 712, the controller 130 may determine a median absolute humidity reading for one or more of the sensors 120a–120n in the event that the absolute humidities detected by one or more of the sensors 120a–120n oscillate during the time period. In this case, the absolute humidity measurements recorded at step 712 may comprise time-averaged values.

At step 716, the controller 130 may calculate a sensor-to-actuator correlation coefficient ($C_i$) for the sensors 120a–120n (i), as described above. Although the correlation coefficient ($C_i$) may be determined through any number of suitable correlation algorithms, the following algorithm may be employed to calculate the correlation coefficients ($C_i$) of the sensors 120a–120n.

$$\text{Equation (6):} \quad C_i = \frac{(AH_1 - AH_2)}{N}.$$

In Equation (6), $AH_1$ is the absolute humidity measurement recorded at step 708 and $AH_2$ is the absolute humidity measurement recorded at step 714. In addition, N is the specified amount of humidification (or dehumidification) change for the CRAC unit 114a at step 710.

At step 718, the humidification (or dehumidification) rate of the CRAC unit 114a may be reset to the flow rate at the first distribution level set at step 704. In addition, it may be determined whether correlations between other CRAC units 114b–114n and the sensors 120a–120b are to be made at step 720. If it is determined that additional correlations are to be determined, the humidification (or dehumidification) of a next CRAC unit 114b may be varied by the specified amount (N) at step 722. The humidification (or dehumidification) of the airflow supplied by the CRAC unit 114b may be varied in manners as described herein above with respect to step 710.

Following step 722, the controller 130 may again wait for a period of time at step 712, prior to recording absolute humidity information received from the sensors 120a–120n at step 714, as described above. In addition, the controller 130 may calculate a sensor-to-actuator correlation coefficient ($C_i$) for the sensors 120a–120n (i) and the CRAC unit 114b at step 716, as also described above. Moreover, the supply air flow rate of the CRAC unit 114b may be reset to the temperature at the first distribution level set at step 704.

Steps 712–722 may be repeated for the remaining CRAC units 114c–114n. In this regard, the correlations between all of the CRAC units 114a–114n and the sensors 120a–120n may be determined and recorded through implementation of the operational mode 700.

If there are no further CRAC units 114a–114n for which correlations to the sensors 120a–120n are to be determined, the collected data may be processed in either of two examples, as indicated by the identifier "A". The collected data may be processed to assign the sensors 120a–120n to one or more CRAC unit 114a–114n families in manners described hereinabove with respect to FIGS. 4B, 4C and 5. Therefore, a detailed explanation of this process is omitted.

Figure 8:
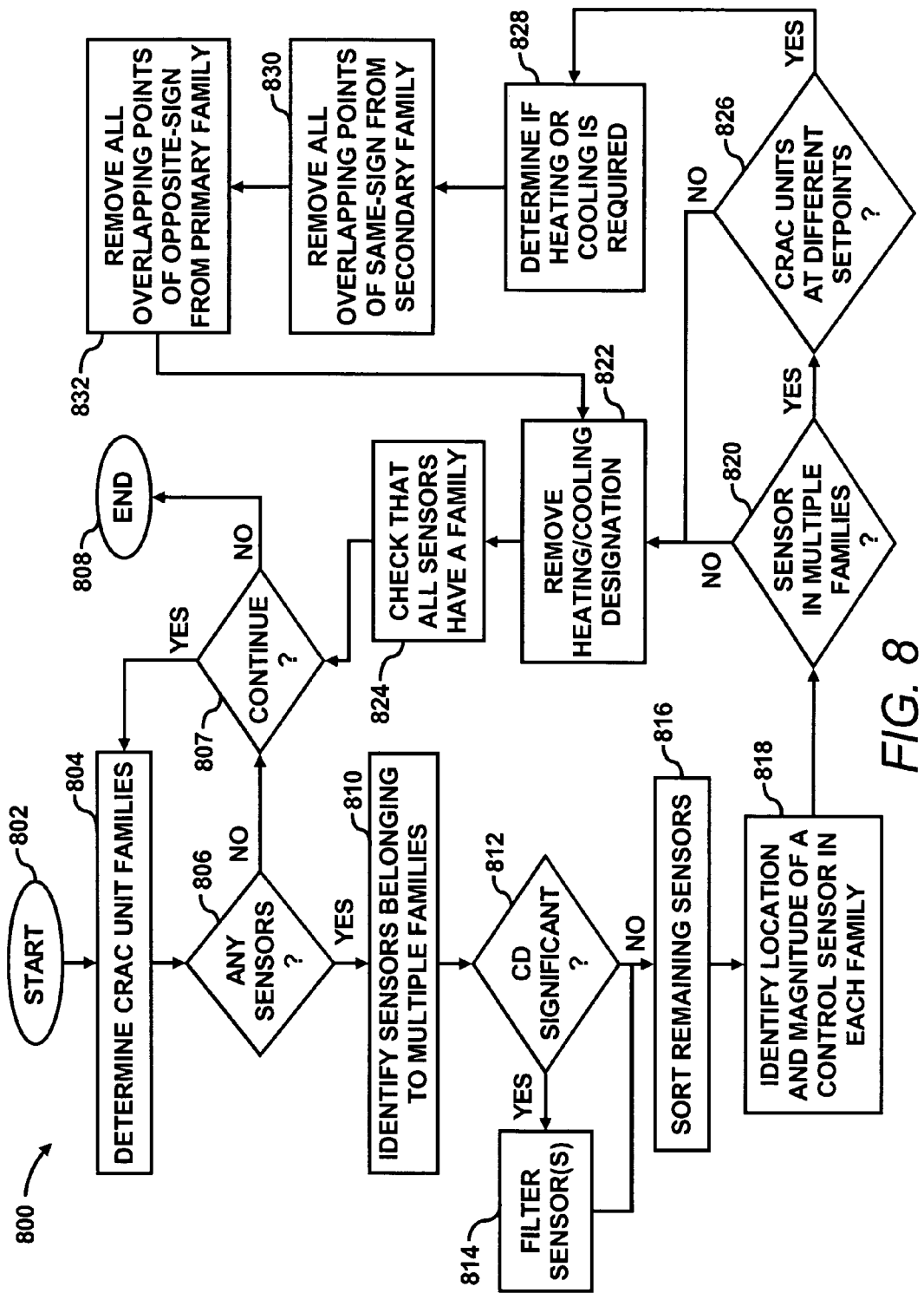
FIG. 8 illustrates a flow diagram of an operational mode for optionally filtering sensors belonging to multiple actuator families, according to an embodiment of the invention.

With reference now to FIG. 8, there is shown a flow diagram of an operational mode 800 for optionally filtering sensors 120a–120n belonging to multiple actuator or CRAC unit 114a–114n families. The operational mode 800 may comprise a filtering algorithm stored in the memory 204 that may be implemented by the controller 130. The controller 130 may also update the information stored in the data storage module 216 based upon the results of the filtering algorithm.

The operational mode 800 may be initiated at step 802 in response to any of a number of stimuli or conditions. For instance, the operational mode 800 may be initiated with activation of the components in the data center 100, such as, the CRAC units 114a–114n. In addition, or alternatively, the operational mode 800 may be manually initiated or the controller 130 may be programmed to initiate the operational mode 800 at various times, for a set duration of time, substantially continuously, etc.

At step 804, the CRAC unit 114a–114n families may be determined. More particularly, the operational mode 400, 600, or 700 and either of operational 450 or 470 may be performed at step 804 to determine which sensors 120a–120n belong to which CRAC unit 114a–114n families. This information may be stored, for instance, in the memory 204. In addition, the controller 130 may access this information to determine whether any of the sensors 120a–120n belong to multiple families at step 806. If none of the sensors 120a–120n belongs to multiple CRAC unit 114a–114n families, it may be determined as to whether the operational mode 800 is to continue at step 807. If it is determined that the operational mode 800 is to continue, the operational mode 800 may be repeated beginning at step 804. In this regard, the operational mode 800 may run in a substantially continuous manner, for instance, with each control cycle, to filter sensors 120a–120n belonging to multiple CRAC unit 114a–114n families. In addition, or alternatively, the operational mode 800 may be continued for a predetermined period of time, a predetermined number of iterations, substantially indefinitely, etc. If it is determined that the operational mode 800 is to be discontinued at step 807, the operational mode 800 may end as indicated at step 808. The operational mode 800 may be re-initiated under any of the conditions described with respect to step 804.

However, if at least one sensor 120a–120n is determined to belong to multiple CRAC unit 114a–114n families, the controller 130 may identify those sensors 120a–120n at step 810. In addition, the controller 130 may compare the correlation levels between the sensors 120a–120n and the CRAC units 114a–114n. More particularly, for each of the identified sensors 120a–120n, the controller 130 may determine whether a correlation difference (CD) among the CRAC unit 114a–114n families is significant at step 812. The correlation difference (CD) may be considered as being significant if it exceeds a correlation difference threshold. The correlation difference threshold may be based upon infrastructure efficiency as determined by the average magnitude of correlation coefficients. Thus, for instance, the higher the average magnitude of correlation coefficients, the greater the correlation difference threshold.

By way of example, if the sensor 120a has a correlation index of 0.7 to the CRAC unit 114a and a correlation index of 0.1 to the CRAC unit 114b, the correlation difference (CD) between the CRAC unit 114a and the CRAC unit 114b is 0.6. If the correlation difference threshold is 0.5, then the correlation difference between the CRAC unit 114a and the CRAC unit 114b is considered to be significant and a "yes" condition is reached at step 812. However, if the correlation difference threshold is 0.7, then the correlation difference between the CRAC unit 114a and the CRAC unit 114b is considered to be insignificant and a "no" condition is reached at step 812.

As shown in the example above, if the identified sensors 120a–120n are more closely related to a particular CRAC unit 114a–114n, the "yes" condition is reached at step 812. In this regard, the sensor 120a–120n is considered to be significantly affected by that particular CRAC unit 114a–114n. As such, at step 814, those sensors 120a–120n that meet the "yes" condition at step 812 may be filtered out. In other words, those sensors 120a–120n may be removed from further filtering operations described in the operational mode 800.

At step 816, following either or both of the "no" condition at step 812 and the filtering operation at step 814, the remaining identified sensors 120a–120n may be sorted according to whether they require heating or cooling. More particularly, those sensors 120a–120n that require heating may be sorted into one group and those sensors 120a–120n that require cooling may be sorted into another group. Sensors 120a–120n that are considered as requiring "heating" may be defined as sensors 120a–120n whose temperatures may be raised to reach a predefined operating level. Sensors 120a–120n that are considered as requiring "cooling" may be defined as sensors 120a–120n whose temperatures may be lowered to reach the predefined operating level. In addition, or alternatively, the designation of whether sensors 120a–120n require cooling or heating may be based upon a comparison between the temperatures measure by the sensors 120a–120n and a temperature reference matrix.

The sensors 120a–120n may be grouped as indicated at step 816 to substantially prevent sensors 120a–120n assigned to multiple CRAC unit families 114a–114n from causing at least one of the CRAC units 114a–114n to cool and at least another one of the CRAC units 114a–114n to heat. In other words, step 816 may be performed to distinguish the sensors 120a–120n and to substantially prevent CRAC units 114a–114n from competing against each other in attempting to maintain the sensors 120a–120n in their families at their desired temperatures.

At step 818, the identity of a control sensor 120a–120n in each CRAC unit 114a–114n family may be determined. In addition, the magnitude of a temperature difference detected by the control sensor 120a–120n may be determined at step 818. The control sensor 120a–120n may be considered as the sensor 120a–120b having the highest difference between the sensed temperature and a reference temperature for each CRAC unit 114a–114n family. The reference temperature for the sensors 120a–120n may comprise a desired temperature for the sensors 120a–120n and may differ for the sensors 120a–120n. In addition, the magnitude of the temperature difference is the sign and amount of the difference in sensed and reference temperatures. In situations where a CRAC unit 114a family includes a sensor 120a requiring cooling and a sensor 120b requiring heating, the sensor 120a requiring cooling is considered as the control sensor for that CRAC unit 114a family, even if the magnitude of the temperature difference is greater for the sensor 120b requiring heating is greater than the magnitude of the temperature difference for the sensor 120a requiring cooling. In addition, the control sensors requiring cooling may be designated as requiring cooling and the control sensors requiring heating may be designated as requiring heating at step 818.

By way of example, in the CRAC unit 114a family, if the sensor 120a has a sensed temperature of 30° C. and a reference temperature of 25° C. and the sensor 120b has a sensed temperature of 32° C. and a reference temperature of 25° C., the sensor 120b is considered as the control sensor for the CRAC unit 114a family. In addition, the magnitude of the temperature difference of the control sensor is +7° C. The sensor 120b is considered the control sensor because the sensor 120b may have the greatest level of control over the CRAC unit 114a since its sensed temperature has the greatest deviation from the reference temperature.

At step 820, it is determined as to whether the control sensors identified at step 818 are the control sensors of multiple CRAC unit 114a–114n families. For those control sensors that are the control sensors of respective single CRAC unit 114a–114n families, the heating or cooling designation given to them and the other sensors 120a–120n in their respective CRAC unit 114a–114n families at step 818 may be removed at step 822. In addition, the sensors 120a–120n may be checked at step 824, to determine whether they are all in at least one CRAC unit 114a–114n family. Should it be determined that at least one of the sensors 120a–120n is not in a CRAC unit 114a–114n family, the operational mode 400 and either of operational mode 450 and 470 may be performed to determine the at least one CRAC unit 114a–114n family of the at least one sensor 120a–120n. In any regard, at step 807, it may be determined as to whether the operational mode 800 is to continue for those control sensors and other sensors 120a–102n in the CRAC unit 114a–114n families 114a–114n of those control sensors. If it is determined that the operational mode 800 is to continue for those control sensors and other sensors 120a–120n, the operational mode 800 may be repeated for those control sensors and other sensors 120a–120n beginning at step 804. If it is determined that the operational mode 800 is to be discontinued at step 807, the operational mode 800 for those control sensors and other sensors 120a–120n may end as indicated at step 808. The operational mode 800 may also be re-initiated under any of the conditions described with respect to step 804.

For those control sensors identified as the control sensors of multiple CRAC unit 114a–114n families, it may be determined whether the CRAC units 114a–114n of the multiple CRAC unit 114a–114n families are at different setpoints at step 826. In other words, for those CRAC units 114a–114n, it may be determined whether the differences in supply air temperatures between the CRAC units 114a–114n exceed a CRAC temperature difference threshold. For those multiple CRAC unit 114a–114n families having CRAC units 114a–114n that do not exceed the CRAC temperature difference threshold, steps 822, 824, 807 and 808 may be performed as described above. In one regard, since the CRAC units 114a–114n are within the CRAC temperature difference threshold, multiple CRAC units 114a–114n may both be used to control the control sensor. However, if it is determined that the CRAC units 114a–114n are at different setpoints or outside of the CRAC temperature difference threshold, it may be determined whether the CRAC units 114a–114n are required to heat or cool the control sensor at step 828.

In addition, at step 828, the control sensor may be assigned to the CRAC unit 114a family having the CRAC unit 114a, whose supply air temperature is the farthest away from the temperature of the control sensor. That CRAC unit 114a family may be considered as the primary family for that control sensor. The other CRAC unit 114b–114n families to which the control sensor is assigned may be considered as secondary families for that control sensor. More particularly, if the control sensor requires cooling, the CRAC unit 114a family having the CRAC unit 114a with the highest supply air temperature is selected as the primary family for that control sensor. Alternatively, if the control sensor requires heating, the CRAC unit 114a family having the CRAC unit 114a with the lowest supply air temperature is selected as the primary family for that control sensor.

If the control sensor requires cooling, all overlapping points having the same sign as the control sensor are removed from the secondary family, as indicated at step 830. More particularly, the sensors 120a–120n that are in both the primary and secondary families and that have the same sign (for instance, requiring either heating or cooling) as the control sensor are removed from the secondary family. In this regard, control over the temperature of the control sensor is given to the CRAC unit 114a that has the highest supply air temperature, if that supply air temperature is greater than the temperature of the control sensor. In this regard, the CRAC unit 114a having the highest supply air temperature may be able to reduce its supply air temperature. Otherwise, if all of the potential control CRAC units 114a–114n have supply air temperatures below the control sensor temperature, control is given to the CRAC unit 114 that is closest in temperature to the control sensor temperature. As such, the CRAC unit 114a that has the greatest supply temperature may be controlled, when the control sensor is in the cooling mode.

If the control sensor requires heating, which means that no other sensors 120a–120n in the primary family require cooling, all overlapping points having the opposite sign as the control sensor are removed from the primary family, as indicated at step 832. More particularly, the sensors 120a–120n that are in both the primary and secondary families and that have the opposite sign as the control sensor are removed from the primary family. In this regard, control over the temperature of the control sensor is given to the CRAC unit 114a that has the lowest supply air temperature, if that supply air temperature is less than the temperature of the control sensor. In this regard, the CRAC unit 114a may be able to increase its supply air temperature. Otherwise, if all of the potential control CRAC units 114a–114n have supply temperatures above the control sensor temperature, control is given to the CRAC unit 114a that is the closest in temperature to the control sensor. Thus, the CRAC unit 114a that has the lowest supply temperature may be controlled, when the control sensor is in the heating mode.

Following step 832, the heating or cooling designation given to the sensors 120a–120n at step 816 may be removed at step 822. In addition, the sensors 120a–120n may be checked at step 824, to determine whether they are all in at least one CRAC unit 114a–114n family. Should it be determined that at least one of the sensors 120a–120n is not in a CRAC unit 114a–114n family, the operational mode 400 and either of operational mode 450 and 470 may be performed to determine the at least one CRAC unit 114a–114n family of the at least one sensor 120a–120n. In addition, or alternatively, sensors 120a–120n that are not in any of the CRAC unit 114a–114n families may be removed from consideration from the operational mode 400 or the cooling infrastructure may be re-arranged, such as by moving vent tiles 118, to bring the sensors 120a–120n within at least one of the CRAC unit 1114a–114n families. In any regard, steps 807 and 808 may be performed as described above.

The operations set forth in the operational modes 300, 400, 450, 470, 600, 700, and 800 may be contained as a utility, program, or subprogram, in any desired computer accessible medium. In addition, the operational modes 300, 400, 450, 470, 600, 700, and 800 may be embodied by a computer program, which can exist in a variety of forms both active and inactive. For example, it can exist as software program(s) comprised of program instructions in source code, object code, executable code or other formats. Any of the above can be embodied on a computer readable medium, which include storage devices.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated above.

Figure 9:
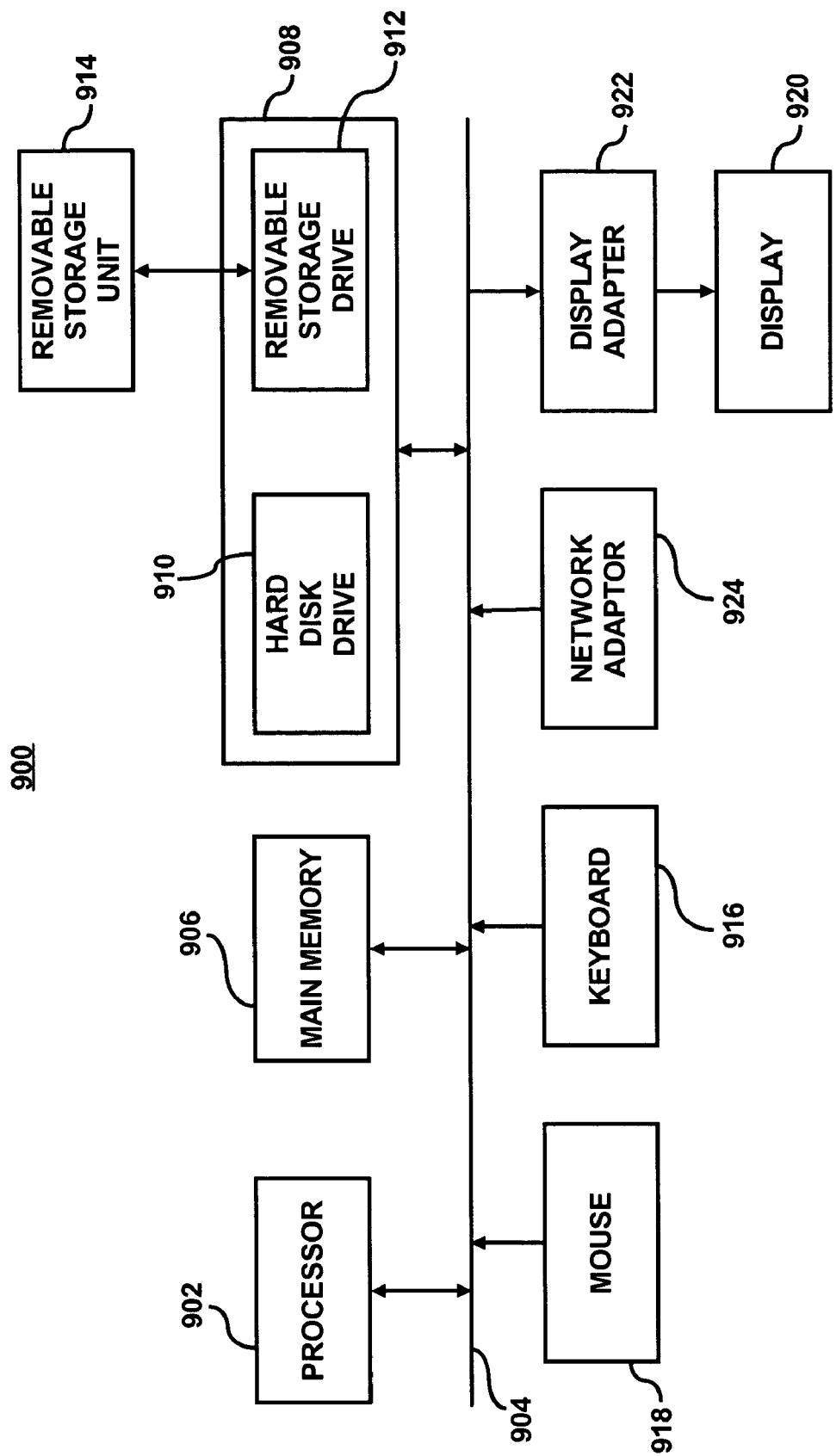
FIG. 9 illustrates a computer system, which may be employed to perform the various functions of the sensor commissioning system, according to an embodiment of the invention.

FIG. 9 illustrates a computer system 900, which may be employed to perform the various functions of the controller 130 described hereinabove, according to an embodiment. In this respect, the computer system 900 may be used as a platform for executing one or more of the functions described hereinabove with respect to the controller 130.

The computer system 900 includes one or more controllers, such as a processor 902. The processor 902 may be used to execute some or all of the steps described in the operational modes 300, 400, 450, 470, 600, 700, and 800. Commands and data from the processor 902 are communicated over a communication bus 904. The computer system 900 also includes a main memory 906, such as a random access memory (RAM), where the program code for, for instance, the controller 130, may be executed during runtime, and a secondary memory 908. The secondary memory 908 includes, for example, one or more hard disk drives 910 and/or a removable storage drive 912, representing a floppy diskette drive, a magnetic tape drive, a compact disk drive, etc., where a copy of the program code for the sensor commissioning system may be stored.

The removable storage drive 910 reads from and/or writes to a removable storage unit 914 in a well-known manner. User input and output devices may include a keyboard 916, a mouse 918, and a display 920. A display adaptor 922 may interface with the communication bus 904 and the display 920 and may receive display data from the processor 902 and convert the display data into display commands for the display 920. In addition, the processor 902 may communicate over a network, for instance, the Internet, LAN, etc., through a network adaptor 924.

It will be apparent to one of ordinary skill in the art that other known electronic components may be added or substituted in the computer system 900. In addition, the computer system 900 may include a system board or blade used in a rack in a data center, a conventional "white box" server or computing device, etc. Also, one or more of the components in FIG. 9 may be optional (for instance, user input devices, secondary memory, etc.).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A method for commissioning sensors, said method comprising:
    determining correlation data between the sensors and a plurality of actuators, wherein the correlation data is based upon conditions detected by the sensors at a plurality of actuator settings, wherein the plurality of actuator settings comprise various flow rate distributions;
    calculating correlation indexes from the correlation data, wherein a correlation index for a sensor is a function of the plurality of actuator settings and a particular actuator; and
    assigning each of the sensors to at least one of a plurality of actuator families based upon the calculated correlation indexes of the sensors, to thereby commission the sensors.

2. The method according to claim 1, wherein the step of calculating the correlation indexes comprises feeding the correlation data into a neural network and determining the correlation indexes based upon a model created by the neural network.

3. The method according to claim 2, further comprising:
    for each sensor, determining whether the correlation index exceeds a predefined threshold for a particular actuator family at a particular plurality of actuator settings; and
    wherein the step of assigning each of the sensors comprises assigning at least one of the sensors to at least one of the plurality of actuator families in response to the correlation index for the at least one sensor exceeding the predefined threshold.

4. The method according to claim 1, wherein the step of calculating the correlation indexes comprises feeding the correlation data into a curve fitting algorithm and determining the correlation indexes based upon equations determined through the curve fitting algorithm.

5. The method according to claim 4, further comprising:
for each sensor, determining whether the correlation index exceeds a predefined threshold for a particular actuator family at a particular plurality of actuator settings; and
wherein the step of assigning each of the sensors comprises assigning at least one of the sensors to at least one of the plurality of actuator families in response to the correlation indexes for the at least one sensor exceeding the predefined threshold.

6. The method according to claim 1, wherein the sensors comprise temperature sensors, the method further comprising:
setting the plurality of actuators to a first distribution level;
recording temperatures of the sensors at a first time;
varying a supply air temperature of an actuator of the plurality of actuators;
recording temperatures of the sensors at a second time; and
wherein the step of determining correlation data comprises determining a correlation between the sensors and the plurality of actuators based upon the recorded temperatures and the settings of the plurality of actuators.

7. The method according to claim 1, wherein the sensors comprise pressure sensors, the method further comprising:
setting the plurality of actuators to a first distribution level;
recording pressures of the sensors at a first time;
varying a supply air flow rate of an actuator of the plurality of actuators;
recording pressures of the sensors at a second time; and
wherein the step of determining correlation data comprises determining a correlation between the sensors and the plurality of actuators based upon the recorded pressures and the settings of the plurality of actuators.

8. The method according to claim 1, wherein the sensors comprise absolute humidity sensors, the method further comprising:
setting the plurality of actuators to a first distribution level;
recording absolute humidities of the sensors at a first time;
varying humidification of airflow supplied by an actuator of the plurality of actuators;
recording absolute humidities of the sensors at a second time; and
wherein the step of determining correlation data comprises determining a correlation between the sensors and the plurality of actuators based upon the recorded absolute humidities and the settings of the plurality of actuators.

9. The method according to claim 1, further comprising:
filtering sensors assigned to multiple actuator families.

10. The method according to claim 9, wherein the step of filtering sensors assigned to multiple actuator families further comprises:
identifying sensors belonging to multiple actuator families;
for each sensor belonging to multiple actuator families:
comparing correlation differences in the correlation indexes of the sensor and each of the multiple actuator families to which each of the sensors belong;
determining whether the correlation differences exceed a correlation difference threshold; and
assigning the sensor to the actuator family to which the sensor has the highest correlation index in response to the correlation differences exceeding the correlation difference threshold.

11. The method according to claim 10, further comprising:
sorting the sensors belonging to multiple actuator families according to whether the sensors require heating or cooling;
identifying a location and magnitude of a control sensor in each of the multiple actuator families;
determining whether the control sensor for a particular actuator family in the multiple actuator families is a control sensor for another actuator family; and
for each control sensor, assigning the control sensor to the particular actuator family in response to the control sensor not being the control sensor for another actuator family.

12. The method according to claim 11, further comprising:
for each remaining control sensor, determining whether the setpoints of the actuators in the multiple actuator families exceed a predefined temperature difference threshold;
determining whether the temperature of the control sensor is above or below a setpoint temperature;
assigning the actuator family having the actuator whose supply air temperature is the farthest away from the temperature of the control sensor as a primary family;
assigning a remaining actuator family as a secondary family; and
adjusting the assignment of each of the sensors to the actuator one of the primary and secondary families.

13. The method according to claim 12, wherein the step of adjusting the assignment of each of the sensors further comprises removing all sensors in both the primary and secondary families having the same sign as the control sensor from the secondary family to thereby give control over the temperature of the control sensor to the actuator having the highest supply air temperature in response to the temperature of the control sensor being above the setpoint temperature.

14. The method according to claim 12, wherein the step of adjusting the assignment of each of the sensors further comprises removing all sensors in both the primary and secondary families having the opposite sign as the control sensor from the primary family to thereby give control over the temperature of the control sensor to the actuator having the lowest supply air temperature in response to the temperature of the control sensor being below the setpoint temperature.

15. A system for commissioning sensors, said system comprising:
a plurality of variously located sensors;
a plurality of actuators, wherein the plurality of actuators are operable to vary conditions detected by the plurality of sensors;
a controller configured to implement at least one algorithm configured to:
determine correlation data between the sensors and the plurality of actuators;
calculate correlation indexes of the sensors from the correlation data; and
assign each of the sensors to at least one of a plurality of actuator families based upon the calculated correlation indexes of the sensors.

16. The system according to claim 15, wherein the controller is further configured to determine the correlation indexes based upon a model created by a neural network, wherein the neural network is formed through a neural network teaching algorithm based upon the correlation data.

17. The system according to claim 15, wherein the controller is further configured to determine the correlation indexes based upon equations determined through a curve fitting algorithm, wherein the curve fitting algorithm is calculated based upon the correlation data.

18. The system according to claim 15, wherein the sensors are operable to detect at least one of temperature, pressure, and humidity.

19. The system according to claim 15, wherein the plurality of actuators comprise computer room air conditioning units.

20. The system according to claim 15, wherein the controller is further configured to filter sensors that are assigned to multiple actuator families and to give control over the temperature of the sensors assigned to multiple actuator families to an actuator of one of the multiple actuator families to substantially increase the efficiencies of the actuators.

21. A data center comprising:
   means for sensing conditions at a plurality of locations in the data center;
   means for actuating, wherein the means for actuating is configured to vary conditions detected by the means for sensing;
   means for calculating correlation indexes between the means for sensing and the means for actuating; and
   means for assigning the means for sensing to at least one means for actuating family based upon the correlation indexes calculated by the means for calculating.

22. The data center according to claim 21, further comprising:
   means for assigning control to the means for actuating when the means for sensing is assigned to multiple means for actuating families.

23. A computer readable storage medium on which is embedded one or more computer programs, said one or more computer programs implementing a method for commissioning sensors with a plurality of actuators, said one or more computer programs comprising a set of instructions for:
   determining correlation data between the sensors and the plurality of actuators, wherein the correlation data is based upon conditions detected by the sensors at a plurality of actuator settings;
   calculating correlation indexes from the correlation data, wherein a correlation index for a sensor is a function of the plurality of actuator settings and a particular actuator; and
   assigning each of the sensors to at least one of a plurality of actuator families based upon the calculated correlation indexes of the sensors to thereby commission the sensors.

24. The computer readable storage medium according to claim 23, wherein said one or more computer programs further comprising comprises a set of instructions for:
   filtering sensors assigned to multiple actuator families.

* * * * *

UNITED STATES PATENT AND TRADEMARK OFFICE
CERTIFICATE OF CORRECTION

PATENT NO. : 7,117,129 B1
APPLICATION NO. : 11/078087
DATED : October 3, 2006
INVENTOR(S) : Cullen E. Bash et al.

It is certified that error appears in the above-identified patent and that said Letters Patent is hereby corrected as shown below:

In column 12, line 52, after "sensors" delete "(i)" and insert -- (j) --, therefor.

In column 23, line 23, delete "1114a-114n" and insert -- 114a-114n --, therefor.

In column 28, line 29, in Claim 24, after "further" delete "comprising".

Signed and Sealed this

Fourth Day of August, 2009

JOHN DOLL
*Acting Director of the United States Patent and Trademark Office*